(12) United States Patent
Griffith

(10) Patent No.: US 8,853,860 B2
(45) Date of Patent: Oct. 7, 2014

(54) METHOD AND APPARATUS FOR REDUCED PARASITICS AND IMPROVED MULTI-FINGER TRANSISTOR THERMAL IMPEDANCE

(71) Applicant: Zachary M. Griffith, Thousand Oaks, CA (US)

(72) Inventor: Zachary M. Griffith, Thousand Oaks, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 0 days.

(21) Appl. No.: 13/719,048

(22) Filed: Dec. 18, 2012

(65) Prior Publication Data

US 2013/0249110 A1 Sep. 26, 2013

Related U.S. Application Data

(60) Provisional application No. 61/615,078, filed on Mar. 23, 2012.

(51) Int. Cl.
| | |
|---|---|
| H01L 23/48 | (2006.01) |
| H03F 1/22 | (2006.01) |
| H01L 23/482 | (2006.01) |
| H03F 3/19 | (2006.01) |
| H01L 21/768 | (2006.01) |
| H01L 29/737 | (2006.01) |
| H01L 29/778 | (2006.01) |

(52) U.S. Cl.
CPC .......... *H03F 1/22* (2013.01); *H01L 2924/0002* (2013.01); *H01L 29/737* (2013.01); *H01L 23/4824* (2013.01); *H01L 29/778* (2013.01); *H03F 3/19* (2013.01); *H01L 23/481* (2013.01); *H01L 21/768 77* (2013.01)
USPC .......................................... 257/774; 438/637

(58) Field of Classification Search
USPC .......................................... 257/774; 438/637
See application file for complete search history.

(56) References Cited

U.S. PATENT DOCUMENTS

| | | | | |
|---|---|---|---|---|
| 2007/0257371 | A1* | 11/2007 | Wakayama et al. | 257/758 |
| 2010/0007024 | A1* | 1/2010 | Uchikoshi et al. | 257/758 |
| 2013/0122672 | A1* | 5/2013 | Or-Bach et al. | 438/199 |

* cited by examiner

*Primary Examiner* — A. Sefer
(74) *Attorney, Agent, or Firm* — Snell & Wilmer LLP

(57) ABSTRACT

A transistor, a method and an apparatus for forming multiple connections to a transistor for reduced gate (FET/HEMT) or base (BJT/HBT) parasitics, and improved multi-finger transistor thermal impedance. Providing for a method and an apparatus that reduces a transistor's parasitics and reduces a transistor's thermal impedance, resulting in higher device bandwidths and higher output power. More particularly, providing for a method and an apparatus for applying compact, multiple connections to the gate of a FET (or HEMT) or the base of a BJT (or HBT) from many sides resulting in reduced parasitics and improved transistor thermal impedance.

9 Claims, 19 Drawing Sheets

US 8,853,860 B2

METHOD AND APPARATUS FOR REDUCED PARASITICS AND IMPROVED MULTI-FINGER TRANSISTOR THERMAL IMPEDANCE

CROSS-REFERENCE TO RELATED APPLICATION

This application claims the benefit and priority of U.S. Provisional Application No. 61/615,078, filed on Mar. 23, 2012. Thus, the entire disclosure of U.S. Provisional Application No. 61/615,078 is hereby incorporated by reference herein.

STATEMENT REGARDING GOVERNMENT RIGHTS

This invention was made with Government support under Contract Nos. N66001-06-C-2025 and W911NF-08-C-0050, both awarded by the Department of Defense. The Government has certain rights in this invention.

BACKGROUND

1. Field

The present invention relates generally to a transistor and more particularly to a method and an apparatus for forming multiple connections to a transistor for reduced gate (FET/HEMT) or base (BJT/HBT) parasitics, and improved multi-finger transistor thermal impedance.

2. Description of Related Art

A transistor is a semiconductor device used to amplify or switch electronic signals and power. Thus, a function of a transistor is its ability to amplify a small signal to a larger signal. Alternatively, another function of a transistor is its ability to serve as a switch to turn current on or off.

Generally, there are two types of transistors. A bipolar junction transistor (BJT) has terminals labeled base, collector, and emitter. A current flowing from the base to the emitter controls (or switches) a larger current between the collector and the emitter. A heterojunction bipolar transistor is a form of a BJT that incorporates a hetero-junction that uses two different materials, with different band gaps, for one or both junctions. A field effect transistor (FET) has terminals labeled gate, drain, and source. A voltage at the gate controls a current between the drain and the source. A high electron mobility transistor (HEMT) is a form of FET that incorporates a hetero-junction that uses two different materials, with different band gaps, on either side of the channel. Typically, a HEMT provides low noise figure and high levels of performance at microwave, mm-wave and sun-mm-wave frequencies. Typically a HBT provides higher gain and a larger operating voltage for performance at microwave, mm-wave, and sub-mm-wave frequencies. Thus, HEMT and HBT technologies are widely used in RF designs where high performance is required at high RF frequencies.

Thus, it is advantageous for a transistor to generate higher transistor bandwidths and higher output power. However, increasing transistor bandwidths requires reductions to the device parasitics to reduce transit delays and increase gain. Device parasitics decrease the speed at which a transistor operates and how much power the transistor can dissipate. The configuration of a transistor strongly influences how much heat it generates for a given power dissipation. Significant challenges exist when scaling the gate resistance and inductance of a FET (or HEMT) or the base resistance and inductance of a BJT (or HBT) because the physical dimension associated with the gate feed resistance and inductance, or the base metal resistance and inductance, can change little. Moreover, physical scaling of the transistor increases the power handling demands it must support before thermal effects degrade its RF performance. The limited physical dimensions associated with the gate feed resistance and inductance, or the base metal resistance and inductance, effectively sets an upper limit to the higher device bandwidth and/or gain achievable for a given technology.

SUMMARY

The present invention is an improvement to existing designs by providing for a method and an apparatus that reduces a transistor's parasitics and reduces a transistor's thermal impedance, resulting in higher device bandwidths and higher output power. More particularly, the present invention also provides for a method and an apparatus for applying compact, multiple connections to the gate of a FET (or HEMT) or the base of a BJT (or HBT) from many sides resulting in reduced parasitics and improved transistor thermal impedance.

In one embodiment, the present invention is a dual-base, single-finger common-emitter HBT. This HBT comprises a thin-film microstrip wiring using low-loss benzocyclobutene (BCB) with a multi-metal layer interconnect, stacked-via technology for compact layout. This dual-base connection reduces the base-metal resistance by approximately 75 percent. Alternatively, this common-emitter HBT can also be a multi-finger common-emitter HBT, having improved thermal impedance.

In another embodiment, the present invention is a dual-base, single-finger common-base HBT. This HBT comprises a thin-film microstrip wiring using low-loss BCB with a multi-metal layer interconnect, stacked-via technology for compact layout. This dual-base connection reduces the base-metal resistance by approximately 75 percent. Alternatively, this common-base HBT can also be a multi-finger common-base HBT, having improved thermal impedance.

In yet another embodiment, the present invention is a dual-gate, double-finger common-source configuration HEMT. This HEMT comprises a thin-film microstrip wiring using low-loss BCB with a multi-metal layer interconnect, stacked via technology for compact layout. This dual-gate connection reduces the rate resistance by more than 50 percent.

By applying more than one connection to a FET (or HEMT) gate or a BJT (or HBT) base, the resistance and inductance of these features are reduced by at least 50 percent. Specifically, for a FET, the effective input gate feed resistance ($R_{feed,1}$) is reduced by approximately 50 percent or completely, and the effective gate-head resistance ($R_{feed,2}$) along the active FET region is reduced by approximately 75 percent. For a HEMT, the effective gate finger metal inductance is reduced by more than 50 percent. For a HBT, the effective base metal resistance along the emitter finger is reduced by approximately 75 percent, and the effective base metal inductance along the emitter is reduced by more than 50 percent.

This multiple input connections approach to a FET (or HEMT) gate or a BJT (or HBT) base surpasses the physical scaling limits of traditional transistors that typically have a single input connection to a HT (or HEMT) gate or a BJT (or Hal) base. Specifically, for a FET (or HEMT), this multiple input connections approach surpasses such physical scaling limits, resulting in greater device bandwidths ($f_{max}$) that would otherwise not be achievable with a traditional single input connection. For a BJT (or HBT), this multiple input connections approach reduces the undesired impact of increased BJT (or HBT) base resistance and inductance which results from a narrower base metal contact, required to make narrower the base-collector semiconductor mesa and increase the device bandwidths.

Moreover, the multi-finger device layout reduces the thermal impedance of the transistor. This lower thermal impedance is achieved by using a transistor with fewer fingers, but fingers greater in length. A lower thermal impedance results in higher operating power densities. More particularly, multi-finger transistors with lower thermal impedance can be used for amplifiers to generate a higher output power, which reduces the complexity of or need for, corporate power combining and the losses that come from such structures. This increases the power added efficiency (PAE) of the amplifier, which is a critical figure-of-merit for power amplifiers.

The present invention can be applied to solid-state power amplifiers (SSPA) in all semiconductor technologies (Si, SiGe, GaN, GaAs, InP, among others) at all frequencies, but is of significant value at the low-mm, mm-, and sub-mm wave regime. Similarly, the present invention can be applied to low-noise amplifiers (LNA), at all operating frequencies. Additionally, the present invention improves upon existing technologies by way of (a) reduced device noise for LNAs, (b) switches with shorter response time, and (c) greatly improved low DC power amplifier gain and bandwidth.

BRIEF DESCRIPTION OF TUE DRAWINGS

Other systems, methods, features and advantages of the present invention will be or will become apparent to one with skill in the art upon examination of the following figures and detailed description. It is intended that all such additional systems, methods, features and advantages be included within this description, be within the scope of the present invention, and be protected by the accompanying claims. Component parts shown in the drawings are not necessarily to scale, and may be exaggerated to better illustrate the important features of the present invention. In the drawings, like reference numerals designate like parts throughout the different views, wherein:

DETAILED DESCRIPTION

Methods and apparatus that implement the embodiments of the various features of the disclosure will now be described with reference to the figures below. The figures and the associated descriptions are provided to illustrate embodiments of the present invention and not to limit the scope of the present invention. Reference in the specification to "one embodiment" or "an embodiment" is intended to indicate that a particular feature, structure, or characteristic described in connection with the embodiment is included in at least an embodiment of the present invention. The appearances of the phrase "in one embodiment" or "an embodiment" in various places in the specification are not necessarily all referring to the same embodiment. Throughout the figures, reference numbers are re-used to indicate correspondence between referenced elements.

Figure 1:
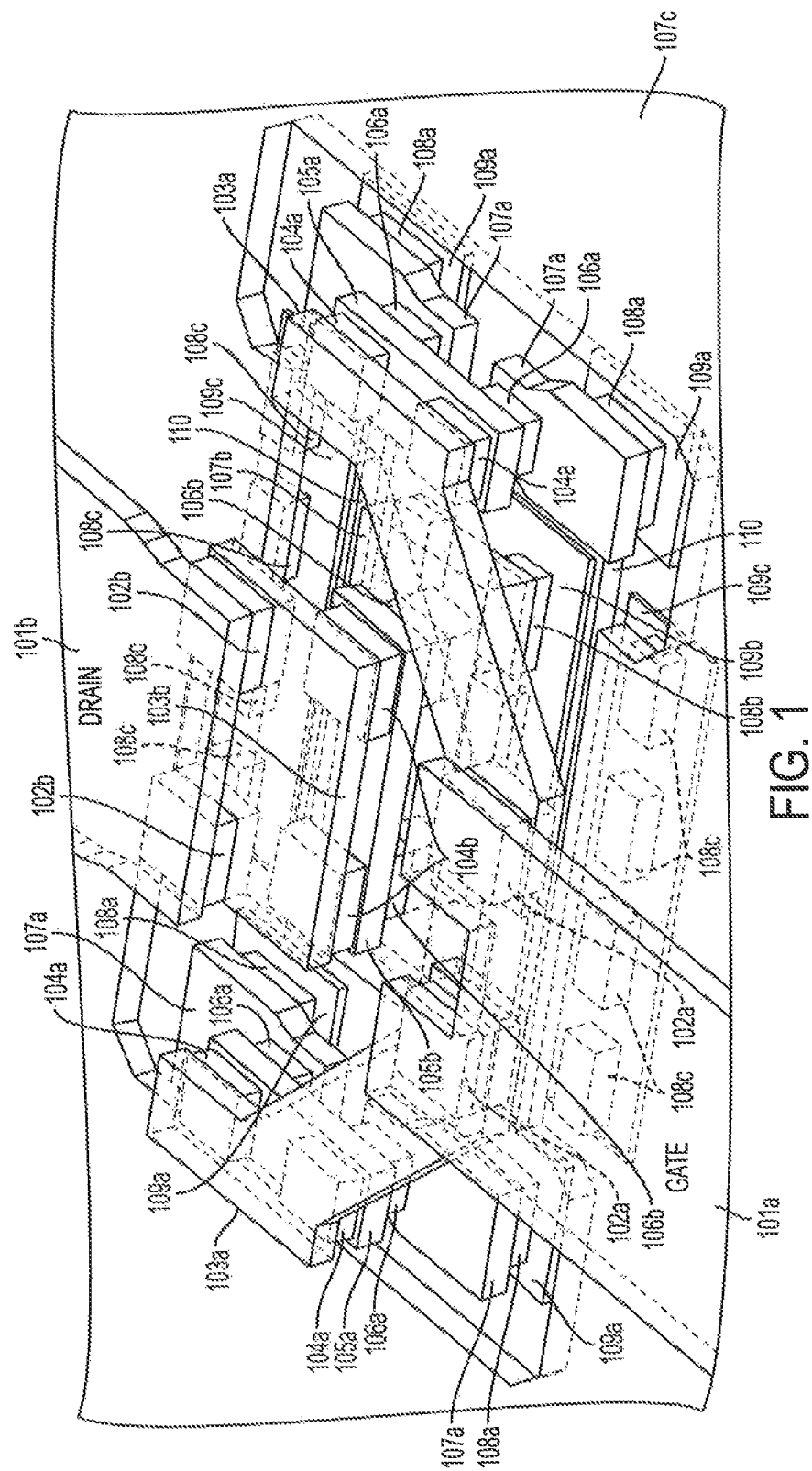
FIG. 1 is an angled-view of an exemplary embodiment of the present invention's dual-gate, two-gate finger, common-source configuration HEMT.
Figure 2:
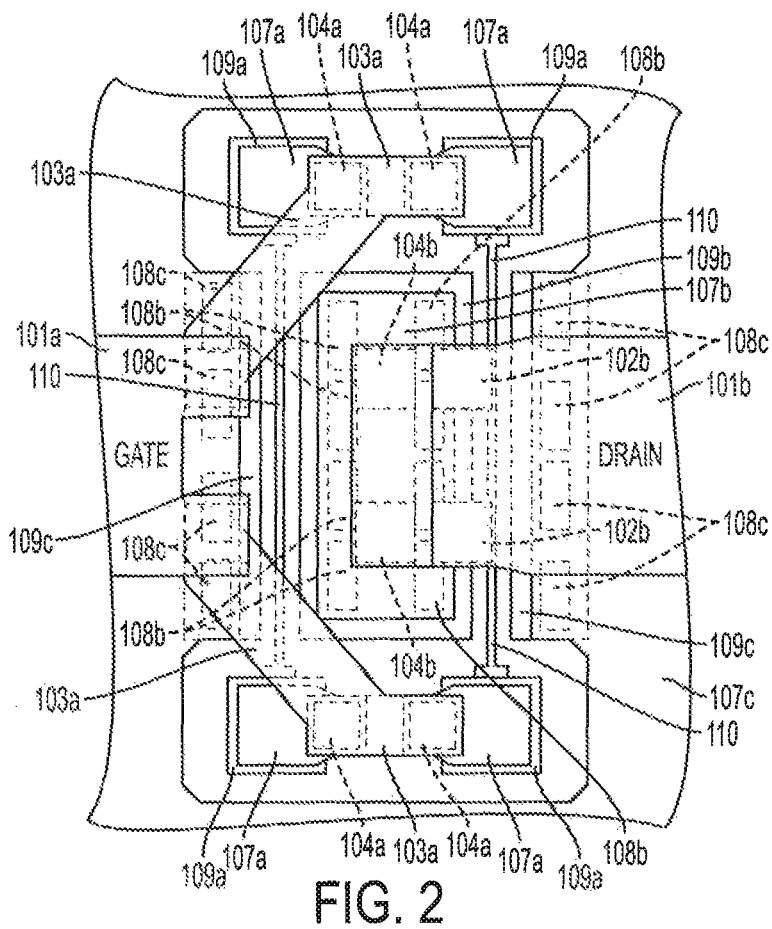
FIG. 2 is a top-view of an exemplary embodiment of the present invention's dual-gate, two-gate finger, common-source configuration HEMT.

FIGS. 1 and 2 depict an exemplary embodiment of the present invention's dual-gate, two-finger, common-source configuration HEMT. FIG. 1 is an angled-view while FIG. 2 is a top-view of this embodiment. The reference numbers in FIG. 1 are re-used in FIG. 2 to indicate correspondence between referenced elements. Typically, in a common-source HEMT configuration, an input is applied at a gate, an output is applied at a drain, and RF ground is applied to a source. In this embodiment, there are five metal layers and interconnect vias positioned between consecutive metal layers. As shown in FIGS. 1-2, from top to bottom, there is a first metal layer comprising 101a and 101b, interconnect vias 102a and 102b, a second metal layer comprising 103a and 103b, interconnect vias 104a and 104b, a third metal layer comprising 105a and 105b, interconnect vias 106a and 106b, a fourth metal layer comprising 107a, 107b and 107c, interconnect vias 108a, 108b, and 108c, and a transistor metal layer comprising 109a, 109b, and 109c. Additionally, there are two gate fingers 110. As shown in FIGS. 1-2, each of these metal layers and vias are configured differently. Each metal layer or via can be made of gold, copper, aluminum, or any metal exhibiting high conductivity and low loss for a DC and/or RE signal.

Each metal layer 101a is 12.5-μm in the x-axis, more than 10.0-μm in the y-axis, and 1.0-μm in the z-axis. Each metal layer 101b is 12.5-μm in the x-axis, more than 10.0-μm in the y-axis, and 1.0-μm in the z-axis. Each metal layer 103a is 13.5-μm in the x-axis, 14.5-μm in the y-axis, and 1.0-μm in the z-axis. Each metal layer 103b is 11.5-μm in the x-axis, 7.5-μm in the y-axis, and 1.0-μm in the z-axis. Each metal layer 105a is 3.0-μm in the x-axis, 8.0-μm in the y-axis, and 1.0-μm in the z-axis. Each metal layer 105b is 11.5-μm in the x-axis, 3.5-μm in the y-axis, and 1.0-μm in the z-axis. Each metal layer 107a is 4.0-μm in the x-axis, 6.5-μm in the y-axis, and 1.0-μm in the z-axis. Each metal layer 107b is 17.5-μm in the x-axis, 7.0-μm in the y-axis, and 1.0-μm in the z-axis. Each metal layer 107c is 1.0-μm in the z-axis. Each metal layer 109a is 5.0-μm in the x-axis, 5.0-μm in the y-axis, and 0.25-μm in the z-axis. Each metal layer 109b is 19.0-μm in the x-axis, 9.0-μm in the y-axis, and 0.25-μm in the z-axis. Each metal layer 109c is 19.0-μm in the x-axis, 4.0-μm in the y-axis, and 0.25-μm in the z-axis.

Collectively, as shown in FIGS. 1-2, this embodiment comprises (a) two interconnect vias 102a (each interconnect via 102a is 3.0-μm in the x-axis, 3.0-μm in the y-axis, and 1.0-μm in the z-axis) between first metal layer 101a and second metal layer 103a, and two interconnect vias 102b (each interconnect via 102b is 3.0-μm in the x-axis, 3.0-μm in the y-axis, and 1.0-μm in the z-axis) between first metal layer 101b and second metal layer 103b; (b) four interconnect vias 104a (each interconnect via 104a is 3.0-μm in the x-axis, 3.0-μm in the y-axis, and 1.0-μm in the z-axis) between second metal layer 103a and third metal layer 105a, and two interconnect vias 104b (each interconnect via 104b is 3.0-μm in the x-axis, 3.0-μm in the y-axis, and 1.0-μm in the z-axis) between second metal layer 103b and third metal layer 105b; (c) four interconnect vias 106a (each interconnect via 106a is 2.0-μm in the x-axis, 2.0-μm in the y-axis, and 1.0-μm in the z-axis) between third metal layer 105a and fourth metal layer 107a, and two interconnect vias 106b (each interconnect via 106b is 2.4-μm in the x-axis, 2.4-μm in the y-axis, and 1.0-tun in the z-axis) between third metal layer 105b and fourth metal layer 107b; and (d) four interconnect vias 108a (each interconnect via 108a is 3.0-μm in the x-axis, 3.0-μm in the y-axis, and 0.7-μm in the z-axis) between fourth metal layer 107a and transistor metal layer 109a, eight interconnect vias 108b (each interconnect via 108b is 3.5-μm in the x-axis, 1.5-μm in the y-axis, and 0.7-μm in the z-axis) between fourth metal layer 107b and transistor metal layer 109b, and eight interconnect vias 108c (each interconnect via 108c is 3.0-μm in the x-axis, 1.5-μm in the y-axis, and 0.7-μm in the z-axis) between fourth metal layer 107c and transistor metal layer 109c. Additionally, as shown in FIGS. 1-2, there are two gate fingers 110 (each gate finger 110 is 25.0-μm in the x-axis, 0.4-μm in the y-axis, and 0.4-μm in the z-axis), whereby each gate finger connects one gate feed's transistor metal layer 109a to the other gate feed's transistor metal layer 109a.

First metal layer 101a provides connections thr an input at the gate, while first metal layer 101b provides connections for an output at the drain. The input or output can be a DC or RF signal. Transistor metal layer 109a, 109b, and 109c provides connections to the transistor semiconductor. As shown in FIGS. 1-2, the gate input at first metal layer 101a connects to the transistor semiconductor at transistor metal layer 109a by way of the following components: first metal layer 101a, two interconnect vias 102a, second metal layer 103a, four interconnect vias 104a, third metal layer 105a, four interconnect vias 106a, fourth metal layer 107a, four interconnect vias 108a, and transistor metal layer 109a. More particularly, in this embodiment, the gate input at first metal layer 101a connects with the transistor semiconductor at transistor metal layer 109a via two gate feeds, as shown in FIGS. 1-2, hence the dual-gate configuration. Thus, each gate feed allows the input at first metal layer 101a to connect with the transistor semiconductor at transistor metal layer 109a by way of the following path: first metal layer 101a, one interconnect via 102a, second metal layer 103a, two interconnect vias 104a, third metal layer 105a, two interconnect vias 106a, fourth metal layer 107a, two interconnect vias 108a, and transistor metal layer 109a.

As shown in FIGS. 1-2, the drain output at first metal layer 1011 connects to the transistor semiconductor at transistor metal layer 109b by way of the following components: first metal layer 101b, two interconnect vias 102b, second metal layer 103b, two interconnect via 104b, third metal layer 105b, two interconnect vias 106b, fourth metal layer 107b, eight interconnect vias 108b, and transistor metal layer 109b. Finally, as shown in FIGS. 1-2, the connection at fourth metal layer 107c connects with the transistor semiconductor at transistor metal layer 109c by way of the following components: fourth metal layer 107c, eight interconnect vias 108c, and transistor metal layer 109c. As shown in FIGS. 1-2, the eight interconnect vias 108c are divided into two sets of four interconnect vias 108c.

As shown in FIGS. 1-2, the novel spatial arrangement of said HEMT's vertical interconnect, comprising (a) metal layers 101a, 101b, 103a, 103b, 105a, 105b, 107a, 107b, 107c, 109a, 109b, and 109c, and (b) vias 102a, 102b, 104a, 104b, 106a, 106b, 108a, 108b, 108c, and 110, reduces the gate finger metal inductance by more than 50 percent, reduces the effective input gate feed resistance ($R_{feed,1}$) by approximately 50 percent or completely, and reduces the effective gate-head resistance ($R_{feed,2}$) along the active FET region is by approximately 75 percent.

Figure 3:
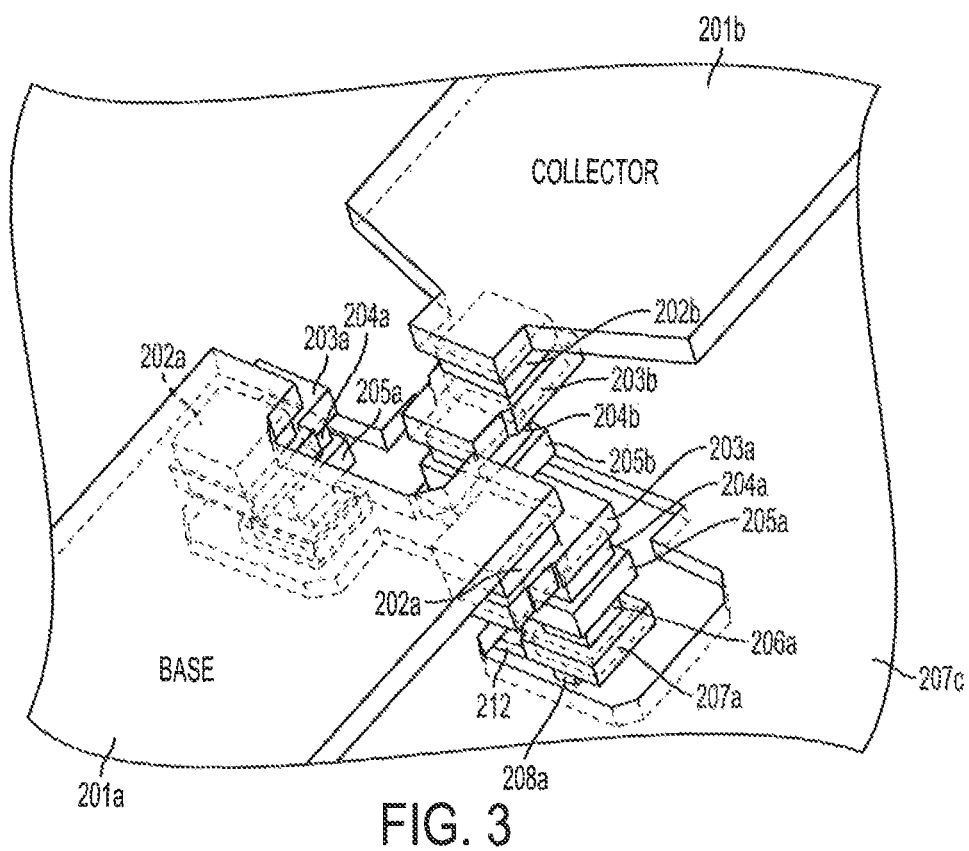
FIG. 3 is a first angled-view of an exemplary embodiment of the present invention's dual-base, common-emitter configuration HBT.
Figure 4:
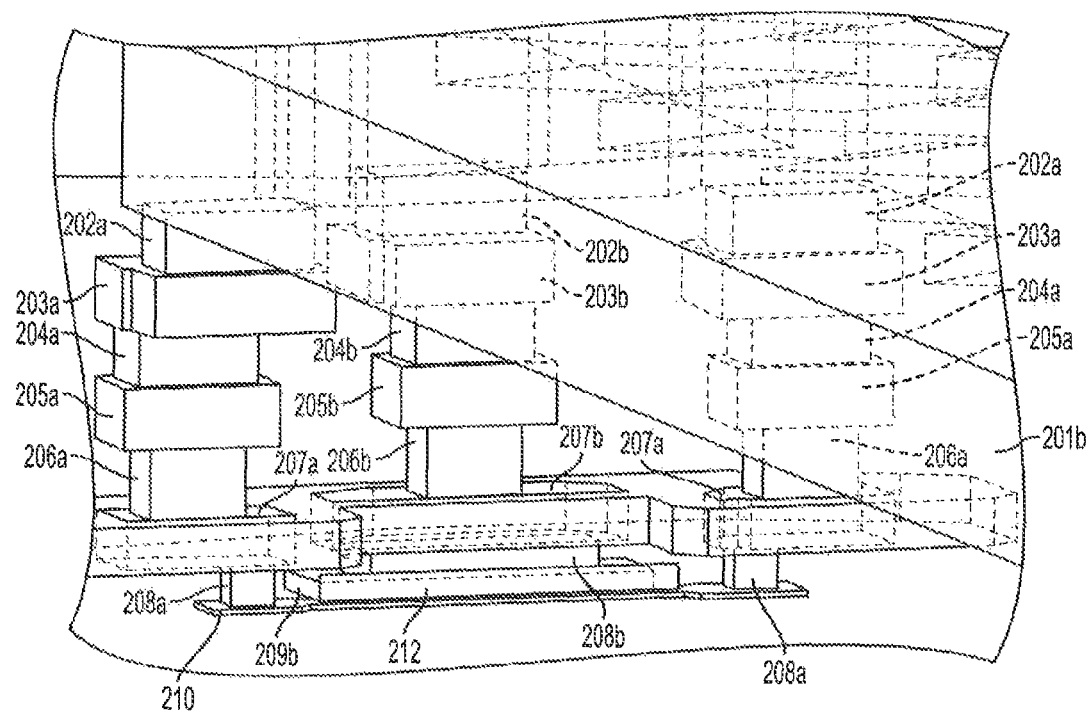
FIG. 4 is a second angled-view of an exemplary embodiment of the present invention's dual-base, common-emitter configuration HBT.
Figure 5:
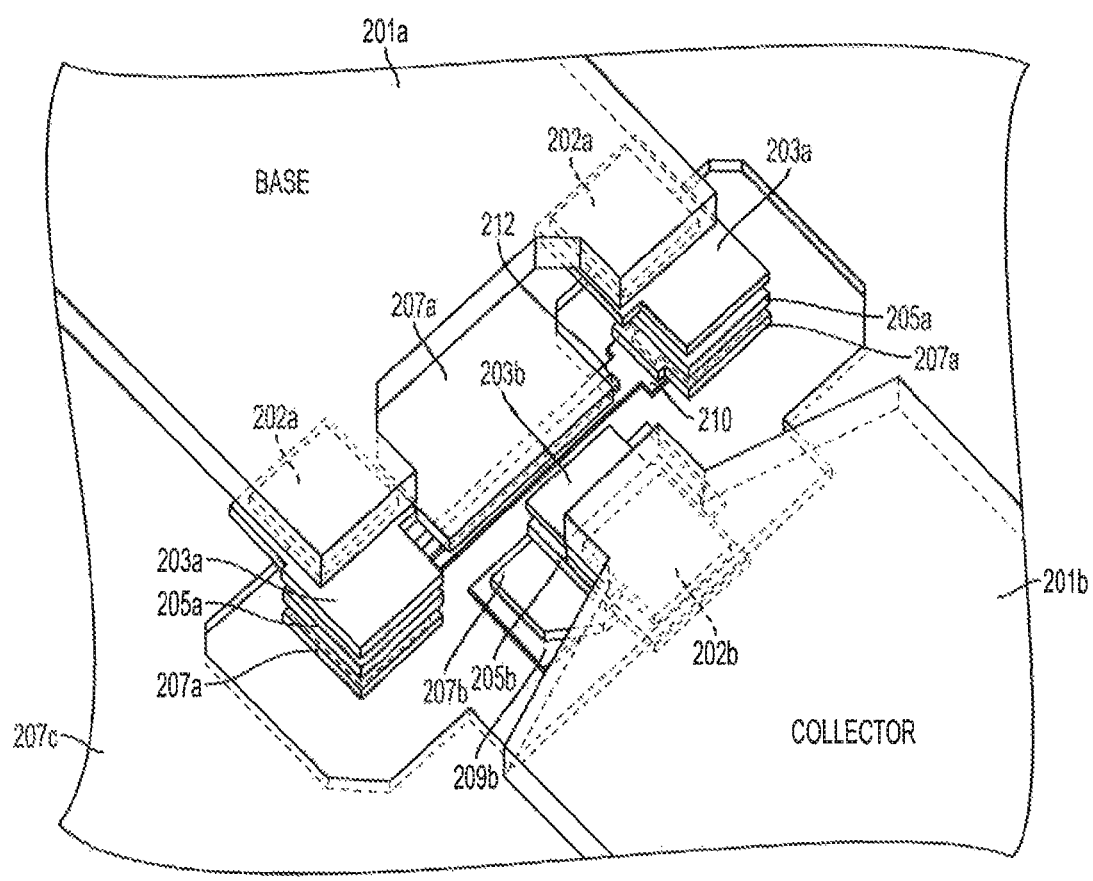
FIG. 5 is a third angled-view of an exemplary embodiment of the present invention's dual-base, common-emitter configuration HBT.

FIGS. 3-5 depict an exemplary embodiment of the present invention's dual-base, common-emitter configuration HBT. FIGS. 3-5 are different angled views of this embodiment. The reference numbers in FIG. 3 are re-used in FIGS. 4 and 5 to indicate correspondence between referenced elements. Typically, in a common-emitter HBT configuration, an input is applied at a base, an output is applied at a collector, and RF ground is applied at an emitter, in this embodiment, there are five metal layers and interconnect vias positioned between consecutive metal layers. As shown in FIGS. 3-5, from top to bottom, there is a first metal layer comprising 201a and 201b, interconnect vias 202a and 202b, a second metal layer comprising 203a and 203b, interconnect vias 204a and 204b, a third metal layer comprising 205a and 205b, interconnect vias 206a and 206b, a fourth metal layer comprising 207a, 207b and 207c, interconnect vias 208a and 208b, and a transistor metal layer comprising 209b. The transistor metal layer 209b serves as contacting metal to the transistor collector. Additionally, there is a transistor base-contact metal 210 and an emitter finger 212. Transistor base-contact metal 210 provides connections to the transistor semiconductor, and the emitter finger 212 serves as the emitter. As shown in FIGS. 3-5, each of these metal layers and vias are configured differently. Each metal layer, via, or emitter finger can be made of gold, copper, aluminum, or any metal exhibiting high conductivity and low loss for a DC and/or RF signal.

Each metal layer 201a is 12.5-μm in the x-axis, more than 10.0-μm in the y-axis, and 3.0-μm in the z-axis. Each metal layer 201b is 12.5-μm in the x-axis, more than 10.0-μm in the y-axis, and 3.0-μm in the z-axis. Each metal layer 203a is 3.0-μm in the x-axis, 4.5-μm in the y-axis, and 1.0-μm in the z-axis. Each metal layer 203b is 3.0-μm in the x-axis, 4.5-μm in the y-axis, and 1.0-μm in the z-axis. Each metal layer 205a is 2.6-μm in the x-axis, 2.6-μm in the y-axis, and 1.0-μm in the z-axis. Each metal layer 205b is 2.6-μm in the x-axis, 2.6-μm in the y-axis, and 1.0-μm in the z-axis. Each metal layer 207a is 3.0-μm in the x-axis, 2.5-μm in the y-axis, and 1.0-μm in the z-axis. Each metal layer 207b is 3.0-μm in the x-axis, 2.0-μm in the y-axis, and 1.0-μm in the z-axis. Each metal layer 207c is 1.0-μm in the z-axis. Each metal layer 209b is 3.7-μm in the x-axis, 2.6-μm in the y-axis, and 0.3-μm in the z-axis.

Collectively, as shown in FIGS. 3-5, this embodiment comprises (a) two interconnect vias 202a (each interconnect via 202a is 2.4-μm in the x-axis, 2.4-μm in the y-axis, and 1.0-μm in the z-axis) between first metal layer 201a and second metal layer 203a, and one interconnect vias 202b (each interconnect via 202b is 2.4-μm in the x-axis, 2.4-μm in the y-axis, and 1.0-μm in the z-axis) between first metal layer 201b and second metal layer 203b; (b) two interconnect vias 204a (each interconnect via 204a is 2.0-μm in the x-axis, 2.0-μm in the y-axis, and 1.0-μm in the z-axis) between second metal layer 203a and third metal layer 205a, and one interconnect via 204b (each interconnect via 204b is 2.0-μm in the x-axis, 2.0-μm in the y-axis, and 1.0-μm in the z-axis) between second metal layer 203b and third metal layer 205b; (c) two interconnect vias 206a (each interconnect via 206a is 1.6-μm in the x-axis, 1.6-μm in the y-axis, and 1.0-μm in the z-axis) between third metal layer 205a and fourth metal layer 207a, and one interconnect via 206b (each interconnect via 206b is 1.6-μm in the x-axis, 1.6-μm in the y-axis, and 1.0-μm in the z-axis) between third metal layer 205b and fourth metal layer 207b; and (d) two interconnect vias 208a (each interconnect via 208a is 0.8-μm in the x-axis, 008-μm in the y-axis, and 0.8-μm in the z-axis) between fourth metal layer 207a and a transistor base-contact metal 210, and one interconnect via 208b (each interconnect via 208a is 2.2-μm in the x-axis, 1.0-μm in the y-axis, and 0.6-μm in the z-axis) between fourth metal layer 207b and transistor metal layer 209b. As shown in FIGS. 3-5, transistor base-contact metal 210 (each transistor base-contact metal 210 is 8.0-μm in the x-axis, 1.6-μm in the y-axis, and 0.06-μm in the z-axis) connects to each base's interconnect via 208a. Additionally, emitter finger 212 (each emitter finger 212 is 0.25-μm in the x-axis, 4.0-μm in the y-axis, and 0.8-μm in the z-axis) is positioned inside and surrounded by transistor base-contact metal 210.

First metal layer 201a provides connections for an input at the base, while first metal layer 201b provides connections for an output at the collector. The input or output can be a DC and/or RE signal. Fourth metal layer 207c provides connections to emitter linger 212 of the transistor, which is exposed above the BCB and accessible. As shown in FIGS. 3-5, the base input at first metal layer 201a connects to the transistor semiconductor at transistor base-contact metal 210 via the components: first metal layer 201a, two interconnect vias 202a, second metal layer 203a, two interconnect vias 204a, third metal layer 205a, two interconnect vias 206a, fourth metal layer 207a, two interconnect vias 208a, and transistor base-contact metal 210.

More particularly, in this embodiment, the base input at first metal layer 201a connects to the transistor semiconductor at transistor base-contact metal 210 via two base feeds, as shown in FIGS. 3-5, hence the dual-base configuration. Thus, each base feed allows the input at first metal layer 201a to connect to the transistor semiconductor at transistor base-contact metal 210 by way of the following path: first metal layer 201a, one interconnect via 202a, second metal layer 203a, one interconnect via 204a, third metal layer 205a, one interconnect via 206a, fourth metal layer 207a, one interconnect via 208a, and transistor base-contact metal 210.

As shown in FIGS. 3-5, the transistor collector output at first metal layer 201b connects to the transistor semiconductor at transistor metal layer 209b by way of the following path: first metal layer 201b, one interconnect via 202b, second metal layer 203b, one interconnect via 204b, third metal layer 205b, one interconnect vias 206b, fourth metal layer 207b, one interconnect via 208b, and transistor metal layer 209b.

As shown in FIGS. 3-5, this novel spatial arrangement of said HBT's vertical interconnect, comprising (a) metal layers 201a, 201b, 203a, 203b, 205a, 205b, 207a, 207b, 207c, and 209b, (b) vias 202a, 202b, 204a, 204b, 206a, 206b, 208a, 208b, and 210, (c) emitter finger 212, reduces the effective base metal resistance along the emitter finger by approximately 75 percent, and reduces the effective base metal inductance along the emitter by more than 50 percent.

Figure 6:
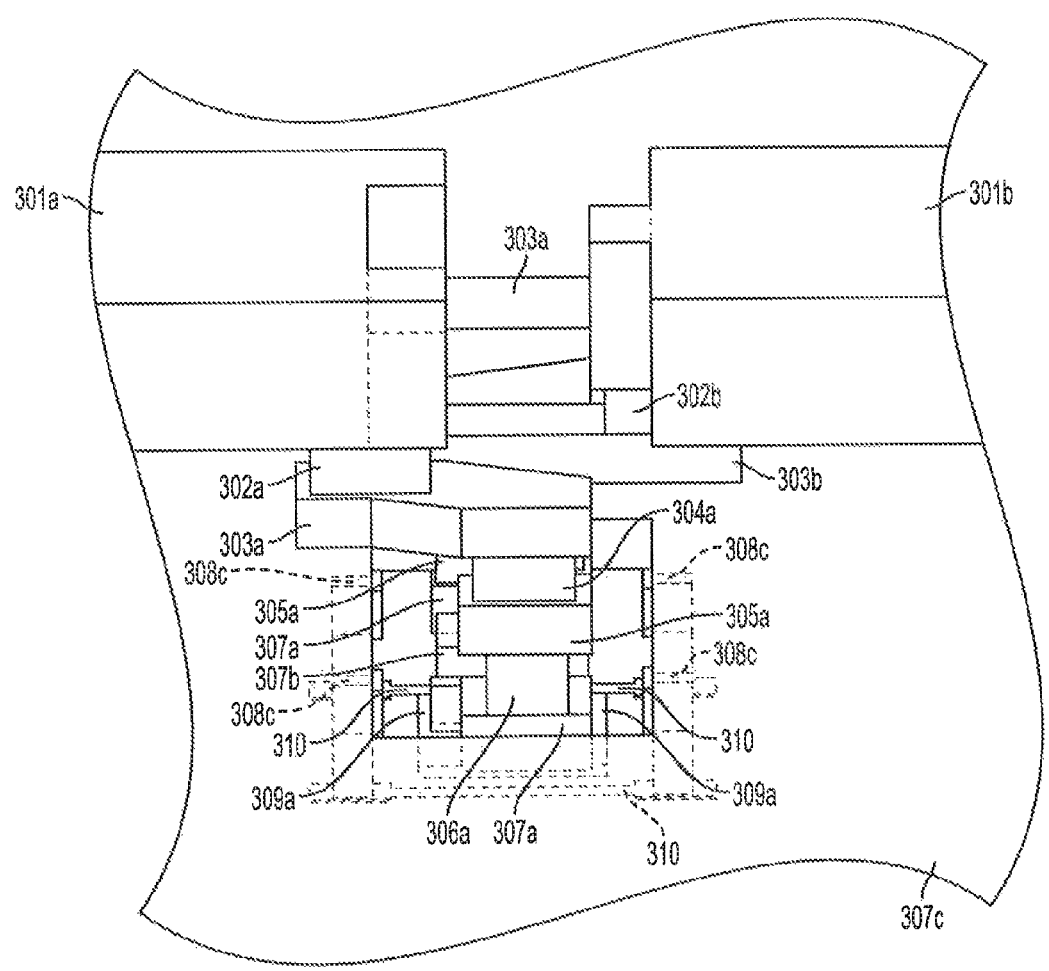
FIG. 6 is an angled-view of an exemplary embodiment of the present invention's dual-emitter, common-base configuration HBT.
Figure 7:
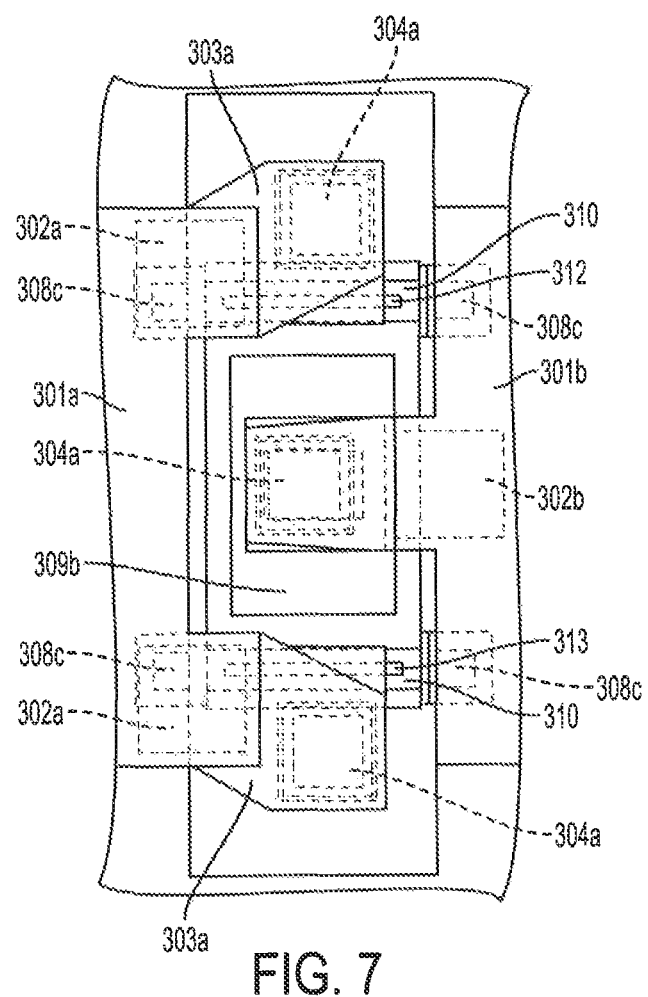
FIG. 7 is a top-view of an exemplary embodiment of the present invention's dual-emitter, common-base configuration HBT.

FIGS. 6-7 depict an exemplary embodiment of the present invention's dual-emitter, common-base configuration HBT. FIG. 6 is an angled-view while FIG. 7 is a top-view of this embodiment. The reference numbers in FIG. 6 are re-used in FIG. 7 to indicate correspondence between referenced elements. Typically, in a common-base HBT configuration, an input is applied at an emitter, an output is applied at a collector, and RF ground is applied at a base. In this embodiment, there are five metal layers and interconnect vias positioned between consecutive metal layers. As shown in FIGS. 6-7, from top to bottom, there is a first metal layer comprising 301a and 301b, interconnect vias 302a and 302b, a second metal layer comprising 303a and 303b, interconnect vias 304a and 304b, a third metal layer comprising 305a and 305b, interconnect vias 306a and 306b, a fourth metal layer comprising 307a, 307b and 307c, interconnect vias 308a and 308b, and a transistor metal layer comprising 309a and 309b. Additionally, there are two transistor base-contact metals 310 and two emitter fingers. Emitter fingers 312 and 313 serve as the emitters. Each metal layer, via, or emitter finger can be made of gold, copper, aluminum, or any metal exhibiting high conductivity and low loss for a DC and/or RE signal.

Each metal layer 301a is 12.5-μm in the x-axis, more than 10.0-μm in the y-axis, and 1.0-μm in the z-axis. Each metal layer 301b is 12.5-μm in the x-axis, more than 10.0-μm in the) y-axis, and 1.0-μm in the z-axis. Each metal layer 303a is 4.0-μm in the x-axis, 6.0-μm in the y-axis, and 1.0-μm in the z-axis. Each metal layer 303b is 3.0-μm in the x-axis, 6.0-μm in the y-axis, and 1.0-μm in the z-axis. Each metal layer 305a is 2.6-μm in the x-axis, 2.6-μm in the y-axis, and 1.0-μm in the z-axis. Each metal layer 307a is 3.6-μm in the x-axis, 3.2-μm in the y-axis, and 1.0-μm in the z-axis. Each metal layer 307b is 3.0-μm in the x-axis, 3.0-μm in the y-axis, and 1.0-μm in the z-axis. Each metal layer 307c is 1.0-μm in the z-axis. Each metal layer 309a is 5.8-μm in the x-axis, 3.7-μm in the y-axis, and 0.3-μm in the z-axis. Each metal layer 309b is 5.8-μm in the x-axis, 3.7-μm in the y-axis, and 0.3-μm in the z-axis.

Collectively, as shown in FIGS. 6-7, this embodiment comprises (a) two interconnect vias 302a (each interconnect via 302a is 2.4-μm in the x-axis, 2.4-μm in the y-axis, and 1.0-μm in the z-axis) between first metal layer 301a and second metal layer 303a, and one interconnect via 302b (each interconnect via 302b is 2.4-μm in the x-axis, 2.4-μm in the y-axis, and 1.0-μm in the z-axis) between first metal layer 301b and second metal layer 303b; (b) two interconnect vias 304a (each interconnect via 304a is 2.0-μm in the x-axis, 2.0-μm in the y-axis, and 1.0-μm in the z-axis) between second metal layer 303a and third metal layer 305a, and one interconnect via 304b (each interconnect via 304b is 2.0-μm in the x-axis, 2.0-μm in the y-axis, and 1.0-μm in the z-axis) between second metal layer 303b and third metal layer 305b; (c) two interconnect vias 306a (each interconnect via 306a is 1.6-μm in the x-axis, 1.6-μm in the y-axis, and 1.0-μm in the z-axis) between third metal layer 305a and fourth metal layer 307a, and one interconnect via 306b (each interconnect via 306b is 1.6-μm in the x-axis, 1.6-μm in the y-axis, and 1.0-μm in the z-axis) between third metal layer 305b and fourth metal layer 307b, and one interconnect via 308b (each interconnect via 308b is 1.5-μm in the x-axis, 4.2-μm in the y-axis, and 0.6-μm in the z-axis) between fourth metal layer 307b and transistor metal layer 309b, and four interconnect vias 308c (each interconnect via 308c is 0.8-μm in the x-axis, 0.8-μm in the y-axis, and 0.8-μm in the z-axis) between fourth metal layer 307c and transistor base-contact metals 310. There are two transistor base-contact metals 310 (each transistor base-contact metal 310 is 8.0-μm in the x-axis, 1.6-μm in the y-axis, and 0.06-μm in the z-axis) and emitter fingers 312 and 313 (each emitter finger 312 and 313 is 0.25-μm in the x-axis, 4.0-μm in the y-axis, and 0.8-μm in the z-axis) with each emitter finger positioned inside and surrounded by transistor base-contact metal 310.

First metal layer 301a provides connections for an input to the emitter, while first metal layer 301b provides connections for an output at the collector. The input or output can be a DC and/or RF signal. Transistor base-contact metals 310 provide connections to the transistor semiconductor. As shown in FIGS. 6-7, the input at first metal layer 301a connects with the emitter fingers 312 and 313 via following components: first metal layer 301a, two interconnect vias 302a, second metal layer 303a, two interconnect vias 304a, third metal layer 305a, two interconnect vias 306a, fourth metal layer 307a, and emitter fingers 312 and 313 that are above the BCB and accessible. More particularly, in this embodiment, the input at first metal layer 301a connects to the emitter fingers 312 and 313, as shown in FIGS. 6-7, hence the dual-emitter configuration. Thus, each feed allows the input at first metal layer 301a to connect with emitter fingers 312 and 313 by way of the following path: first metal layer 301a, one interconnect via 302a, second metal layer 303a, one interconnect via 304a, third metal layer 305a, one interconnect via 306a, fourth metal layer 307a and emitter fingers 312 and 313.

As shown in FIGS. 6-7, the transistor collector output at first metal layer 301b connects to the transistor semiconductor at transistor metal layer 309b by way of the following components: first metal layer 301b, one interconnect via 302b, second metal layer 303b, one interconnect via 304b, third metal layer 305b, one interconnect via 3061, fourth metal layer 307b, one interconnect via 308b, and transistor metal layer 309b. Finally, as shown in FIGS. 6 7, DC and/or RF ground potential at fourth metal layer 307c connects to the transistor semiconductor by way of the following components: fourth metal layer 307c, interconnect vias 308c, and transistor base-contact metals 310.

As shown in FIGS. 6-7, this novel spatial arrangement of said HBT's vertical interconnect, comprising (a) metal layers 301a, 301b, 303a, 303b, 305a, 305b, 307a, 307b, 307c, 309a, and 309b, (b) vias 302a, 302b, 304a, 304b, 306a, 306b, 308a, 308b, and 310, (c) emitter fingers 312 and 313, reduces the effective base metal resistance along the emitter finger by approximately 75 percent, and reduces the effective base metal inductance along the emitter by more than 50 percent.

Figure 8:
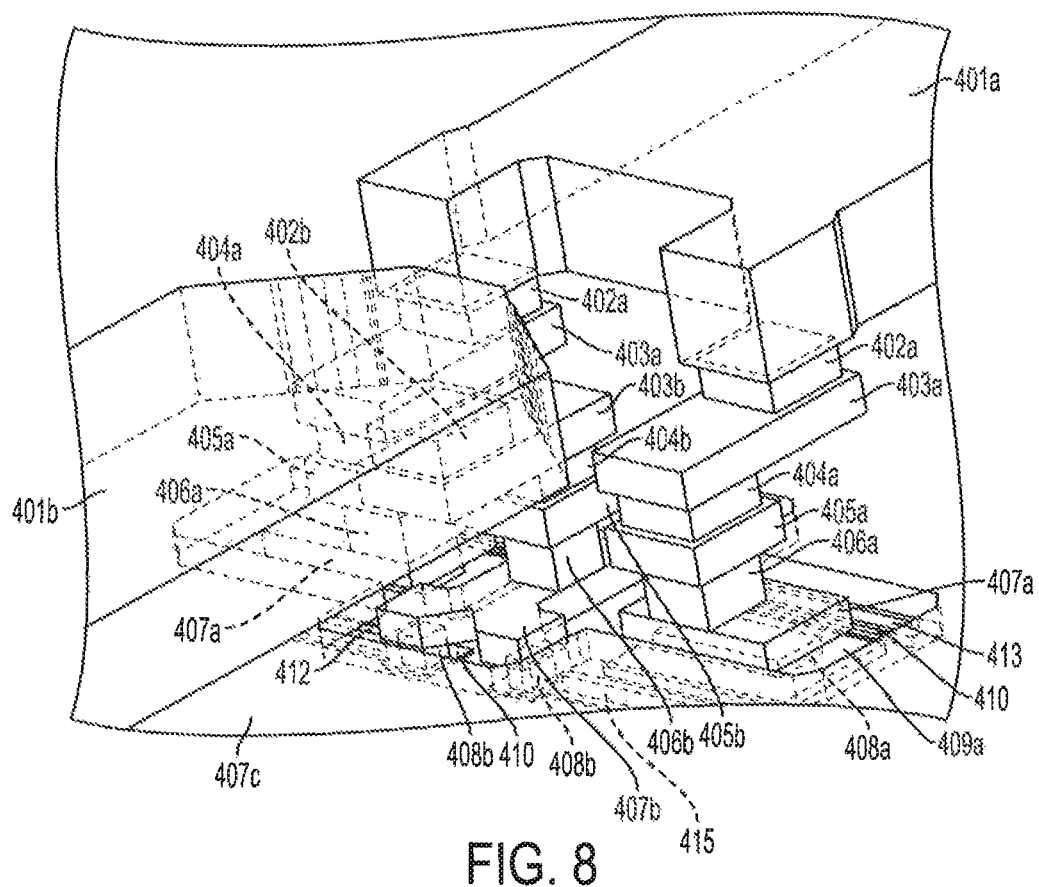
FIG. 8 is a first angled-view of an exemplary embodiment of the present invention's four-finger, common-emitter configuration HBT.
Figure 9:
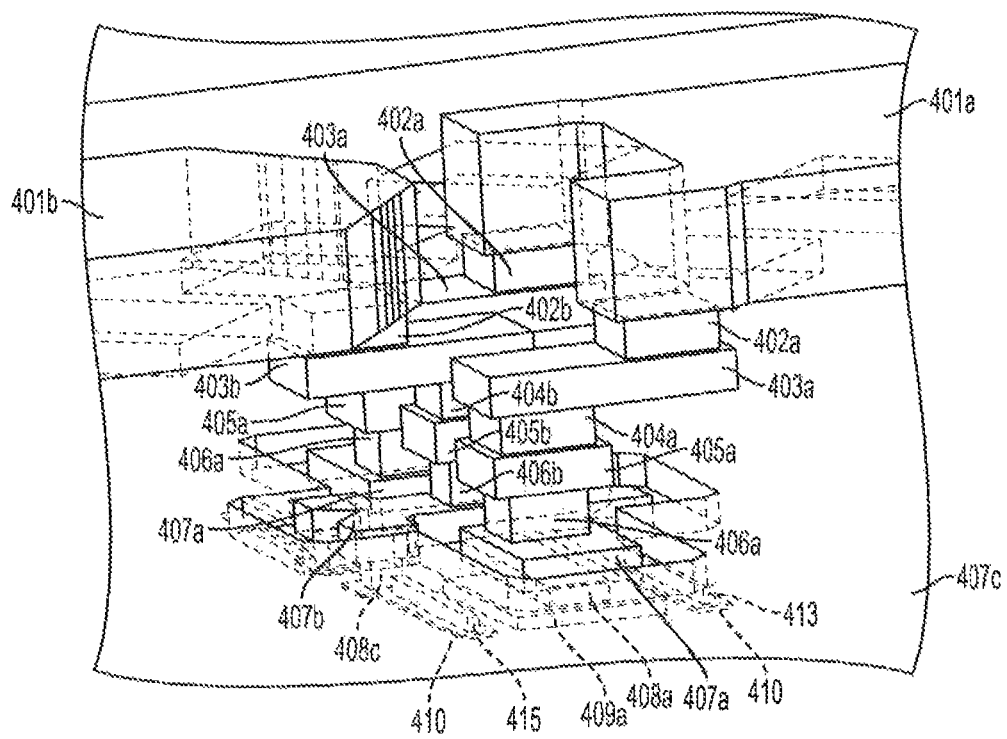
FIG. 9 is a second angled-view of an exemplary embodiment of the present invention's four-finger, common-emitter configuration HBT.
Figure 10:
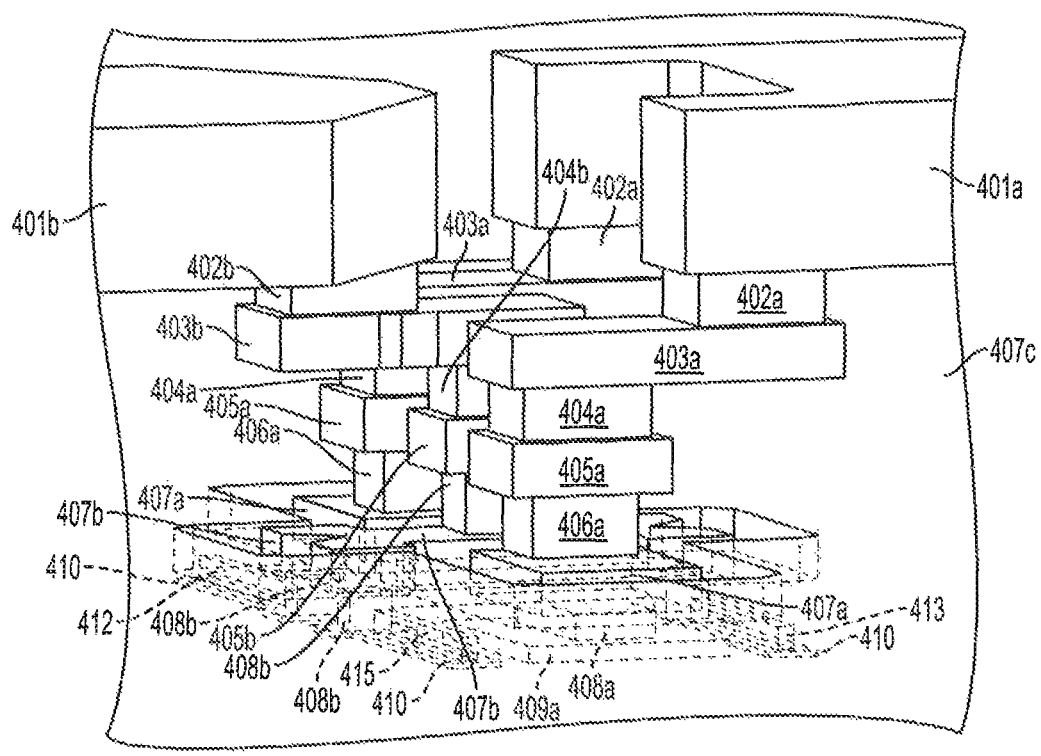
FIG. 10 is a third angled-view of an exemplary embodiment of the present invention's four-finger, common-emitter configuration HBT.
Figure 11:
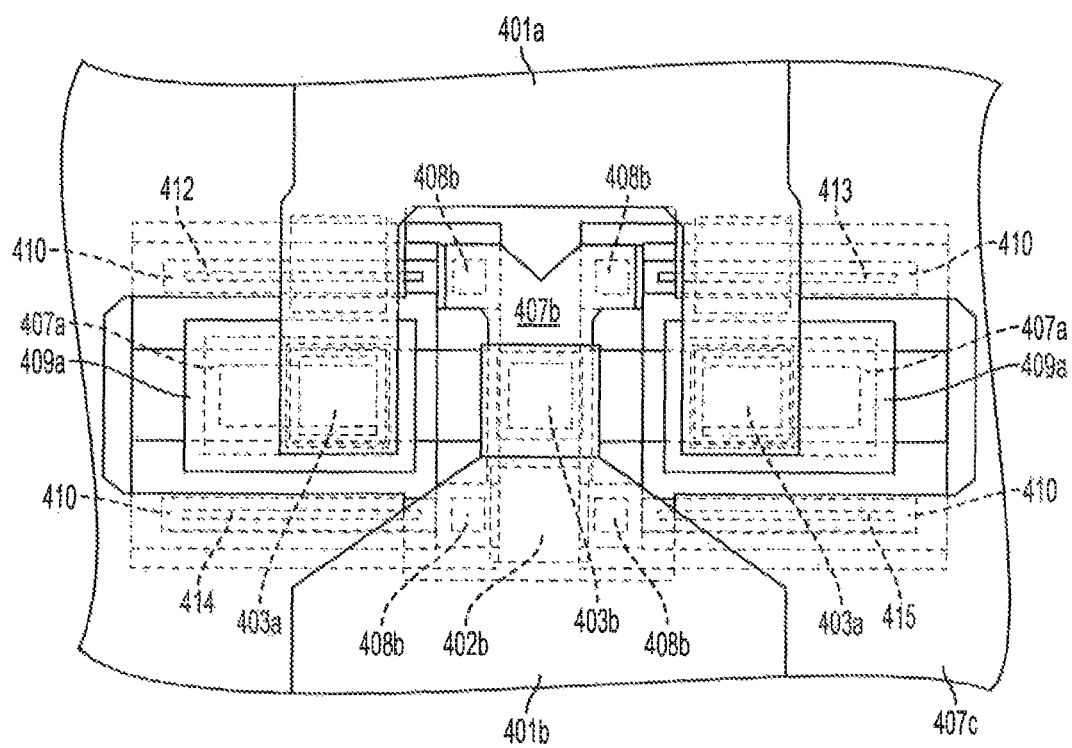
FIG. 11 is a top-view of an exemplary embodiment of the present invention's four-finger, common-emitter configuration HBT.

FIGS. 8-11 depict an exemplary embodiment of the present invention's four-finger, common-emitter configuration HBT. FIGS. 8-10 are different angled-views, while FIG. 11 is a top-view of this embodiment. The reference numbers in FIG. 8 are re-used in FIGS. 9-11 to indicate correspondence between referenced elements. Typically, in a common-emitter HBT configuration, an input is applied at a base, an output is applied at a collector, and RF ground is applied at an emitter. In this embodiment, there are five metal layers and interconnect vias positioned between consecutive metal layers. As shown in FIGS. 8-11, from top to bottom, there is a first metal layer comprising 401a and 401b, interconnect vias 402a and 402b, a second metal layer comprising 403a and 403b, interconnect vias 404a and 404b, a third metal layer comprising 405a and 405b, interconnect vias 406a and 406b, a fourth metal layer comprising 407a, 407b and 407c, interconnect vias 408a, 408b, and 408c, and a transistor metal layer comprising 409a and 409b. Additionally, there are four transistor base-contact metals 410 and four emitter fingers. Transistor base-contact metals 410 provide connections to the transistor semiconductor, and the emitter fingers 412, 413, 414, and 415 serve as the emitters. As shown in FIGS. 8-11, each of these metal layers and vias are configured differently. Each metal layer, via, or emitter finger can be made of gold, copper, aluminum, or any metal exhibiting high conductivity and low loss for a DC and/or RF signal.

Each metal layer 401a is 12.5-μm in the x-axis, more than 10.0-μm in the y-axis, and 3.0-μm in the z-axis. Each metal layer 401b is 12.5-μm in the x-axis, more than 10.0-μm in the y-axis, and 300-μm in the z-axis. Each metal layer 403a is 3.0-μm in the x-axis, 6.3-μm in the y-axis, and 1.0-μm in the z-axis. Each metal layer 403b is 3.0-μm in the x-axis, 5.8-μm in the y-axis, and 1.0-μm in the z-axis. Each metal layer 405a is 3.0-μm in the x-axis, 3.0-μm in the y-axis, and 1.0-μm in the z-axis. Each metal layer 405b is 2.6-μm in the x-axis, 2.6-μm in the y-axis, and 1.0-μm in the z-axis. Each metal layer 407a is 4.9-μm in the x-axis, 3.0-μm in the y-axis, and 1.0-μm in the z-axis. Each metal layer 407b is 4.8-μm in the x-axis, 6.7-μm in the y-axis, and 1.0-μm in the z-axis. Each metal layer 407c is 1.0-μm in the z-axis. Each metal layer 409a is 5.8-μm in the x-axis, 3.7-μm in the y-axis, and 0.3-μm in the z-axis.

Collectively, as shown in FIGS. 8-11, this embodiment comprises (a) two interconnect vias 402a (each interconnect via 402a is 2.4-μm in the x-axis, 2.4-μm in the y-axis, and 1.0-μm in the z-axis) between first metal layer 401a and second metal layer 403a, and one interconnect via 402b (each interconnect via 402b is 2.4-μm in the x-axis, 204-μm in the y-axis, and 1.0-μm in the z-axis) between first metal layer 401b and second metal layer 403b; (b) two interconnect vias 404a (each interconnect via 404a is 2.0-μm in the x-axis, 2.0-μm in the y-axis, and 1.0-m in the z-axis) between second metal layer 403a and third metal layer 405a, and one interconnect via 404b (each interconnect via 404b is 2.4-μm in the x-axis, 2.4-μm in the y-axis, and 1.0-μm in the z-axis) between second metal layer 403b and third metal layer 405b; (c) two interconnect vias 406a (each interconnect via 406a is 2.0-μm in the x-axis, 2.0-μm in the y-axis, and 1.0-μm in the z-axis) between third metal layer 405a and fourth metal layer 407a, and one interconnect via 406b (each interconnect via 406b is 1.6-μm in the x-axis, 1.6-μm in the y-axis, and 1.0-μm in the z-axis) between third metal layer 405b and fourth metal layer 407b; and (d) two interconnect vias 408a (each interconnect via 408a is 4.0-μm in the x-axis, 1.5-μm in the y-axis, and 0.6-μm in the z-axis) between fourth metal layer 407a and transistor collector metal layer 409a, and four interconnect vias 408b (each interconnect via 408b is 0.8-μm in the x-axis, 0.8-μm in the y-axis, and 0.8-μm in the z-axis) between fourth metal layer 407b and transistor metal layer 410. Additionally, emitter fingers 412, 413, 414, and 415 (each emitter finger 412-415 is 0.25-μm in the x-axis, 6.0-μm in the y-axis, and 0.8-μm in the z-axis) are each positioned inside and surrounded by each of the four transistor base-contact metals 410 (each transistor base-contact metal 410 is 8.5-μm in the x-axis, 1.6-μm in the y-axis, and 0.06-μm in the z-axis).

First metal layer 401a provides connections for an output at the collector, while first metal layer 401b provides connections for an input at the base. The input or output can be a DC and/or RF signal. As shown in FIGS. 8-11, the base input at first metal layer 401b connects to the transistor at transistor base-contact metals 410 by way of the following components: first metal layer 401b, one interconnect via 402b, second metal layer 403b, one interconnect via 404b, third metal layer 405b, one interconnect via 406b, fourth metal layer 407b, one interconnect via 408b, and transistor base-contact metals 410.

As shown in FIGS. 8-11, the transistor collector output at first metal layer 401a connects to the transistor semiconductor at transistor metal layer 409a via the components: first metal layer 401a, two interconnect via 402a, second metal layer 403a, two interconnect vias 404a, third metal layer 405a, two interconnect vias 406a, fourth metal layer 407a, four interconnect vias 408a, and transistor metal layer 409a. Fourth metal layer 407c provides connections to emitter fingers 412, 413, 414, and 415 of the transistor, which are exposed above the BCB and accessible. Thus, as shown in FIGS. 8-11, fourth metal layer 407c connects to emitters by way of the following components: fourth metal layer 407c and emitter fingers 412, 413, 414, and 415 of the transistor, which are exposed above the BCB and accessible.

Figure 15:
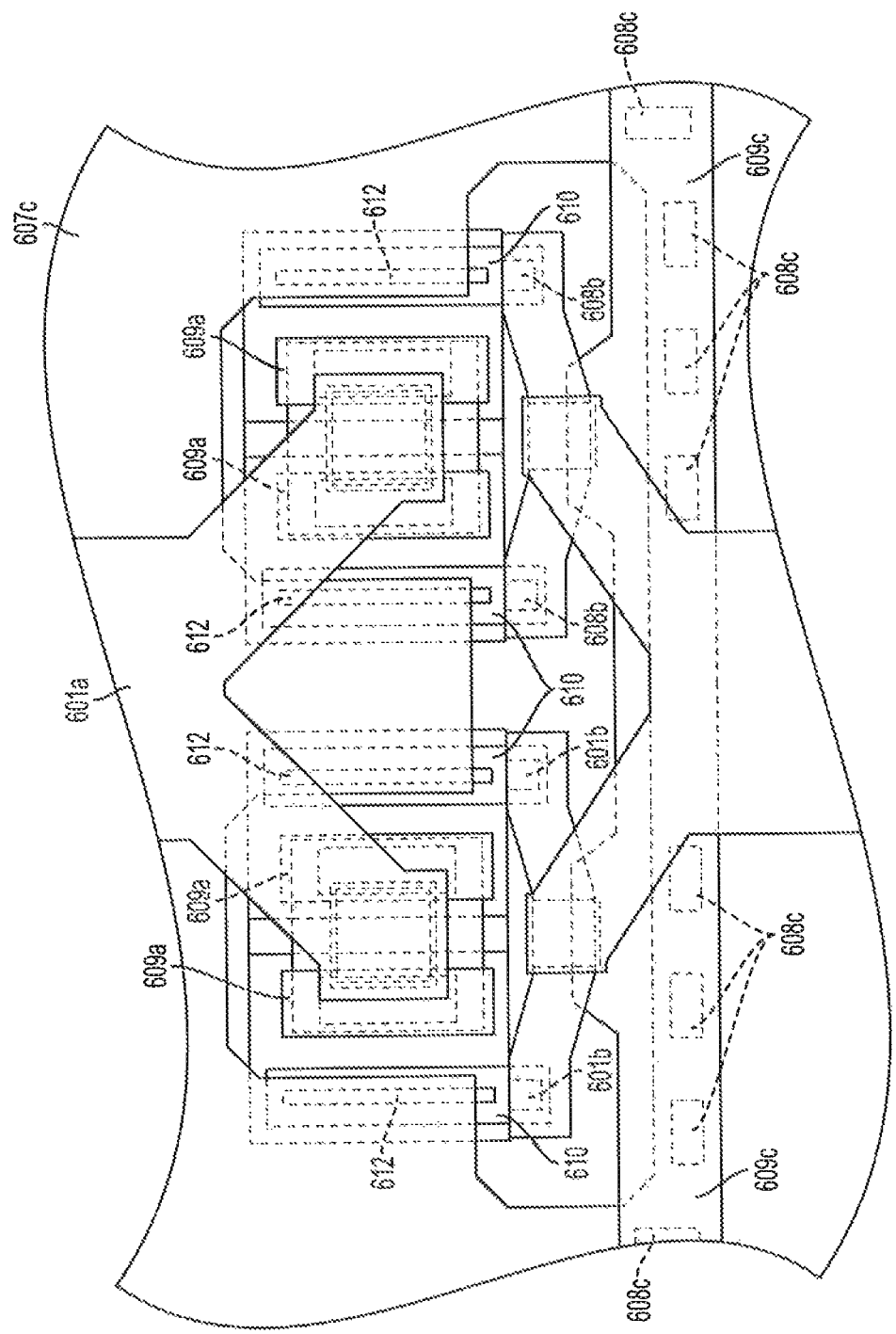
FIG. 15 is a top-view of an exemplary embodiment of a traditional layout for a four finger common-emitter HBT.

As shown in FIGS. 8-11, this novel spatial arrangement of said HBT's vertical interconnect, comprising (a) metal layers 401a, 401b, 403a, 403b, 405a, 405b, 407a, 407b, 407c, and 409a, (b) vias 402a, 402b, 404a, 404b, 406a, 406b, 408a, 408b, and 410, (c) emitter fingers 412 413, 414, and 415, reduces the effective base metal resistance along the emitter finger by approximately 75 percent, and reduces the effective base metal inductance along the emitter by more than 50 percent. Additionally, emitter fingers 412, 413, 414, and 415 are each approximately 6-μm in length. Based on both x-lines and y-lines of symmetry, emitter fingers 412 and 413 effectively constitute one long emitter finger, and emitter fingers 414 and 415 effectively constitute another long emitter finger. Hence, this embodiment effectively has two long emitter fingers. These two long emitter fingers result in a significant reduction in thermal impedance, as compared to a traditional layout of a four-finger, common-emitter HBT. In addition, the connection of emitters 412, 413, 414, and 415 directly to the large forth metal layer 407c provides an effective secondary path for heat flow from the transistor, which decreases and improves the transistor thermal impedance by 20-25 percent. FIG. 15 depicts a traditional layout for a four-finger, common-emitter HBT.

Figure 12:
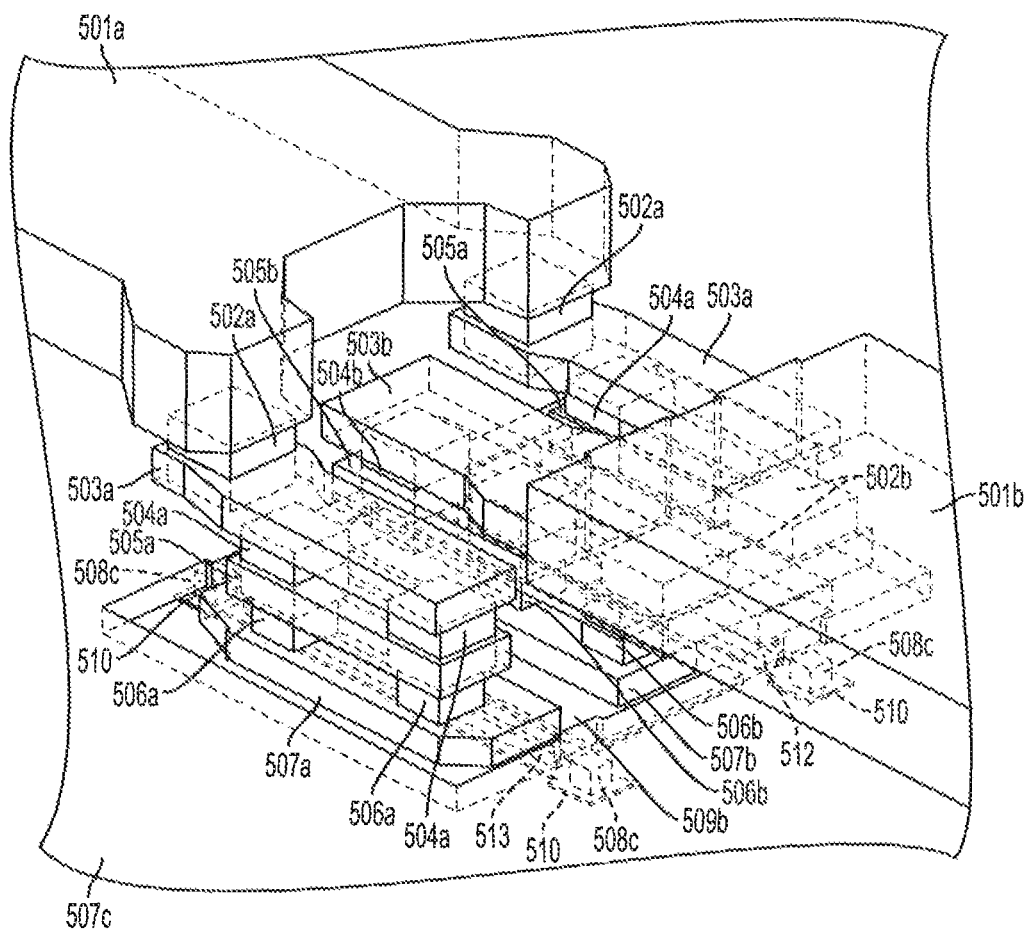
FIG. 12 is a first angled-view of an exemplary embodiment of the present invention's dual-emitter, two-finger, common-base configuration HBT.
Figure 13:
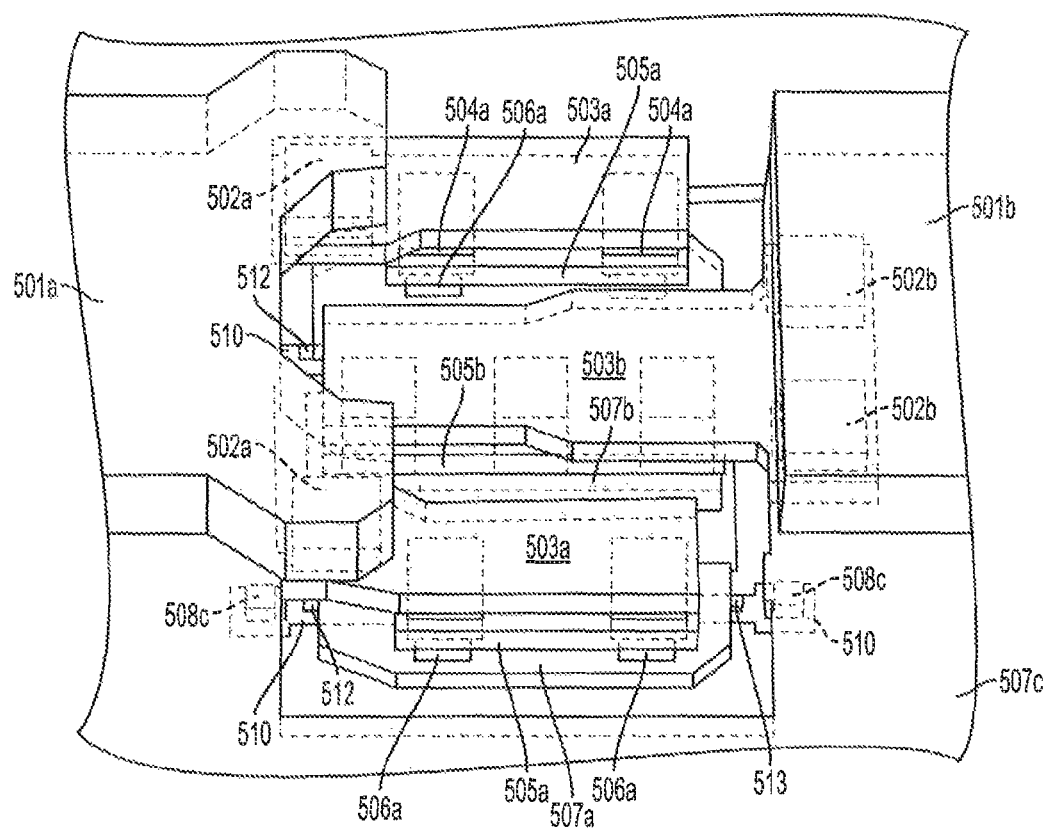
FIG. 13 is a second angled-view of an exemplary embodiment of the present invention's dual-emitter, two-finger, common-base configuration HBT.
Figure 14:
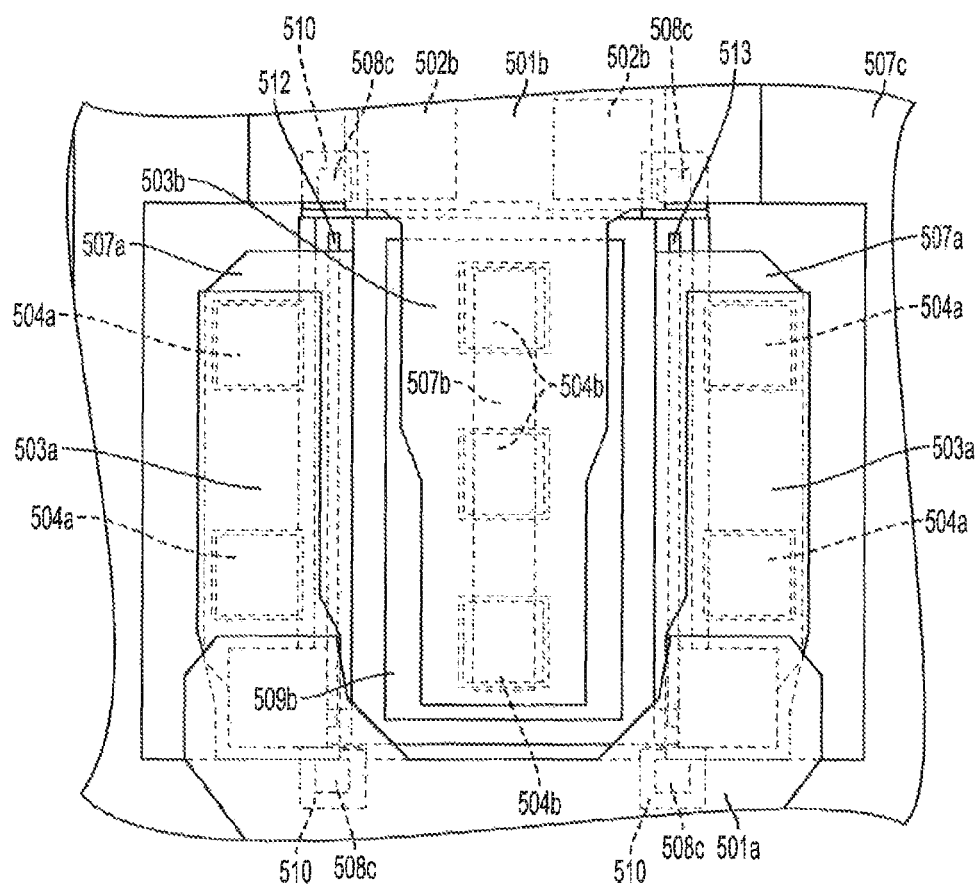
FIG. 14 is a top-view of an exemplary embodiment of the present invention's dual emitter, two-finger, common-base configuration HBT.

FIGS. 12-14 depict an exemplary embodiment of the present invention's dual-emitter, two-finger, common-base configuration HBT. FIGS. 12-14 are different angled-views of this embodiment. The reference numbers in FIG. 12 are re-used in FIGS. 13-14 to indicate correspondence between referenced elements. Typically, in a common-base HBT configuration, an input is applied at an emitter, an output is applied at a collector, and RF ground is applied at a base. In this embodiment, there are five metal layers and interconnect vias positioned between consecutive metal layers. As shown in FIGS. 12-14, from top to bottom, there is a first metal layer comprising 501a and 501b, interconnect vias 502a and 502b, a second metal layer comprising 503a and 50M, interconnect vias 504a and 504b, a third metal layer comprising 505a and 505b, interconnect vias 506s and 506b, a fourth metal layer comprising 507a, 507b and 507c, interconnect vias 508a, 508b, and 508c, and a transistor metal layer comprising 509b.

Additionally, there are two transistor base-contact metals 510 and two emitter fingers 512 and 513. Emitter fingers 512 and 513 serve as the emitters. As shown in FIGS. 12-14, each of these metal layers and vias are configured differently. Each metal layer, via, or emitter finger can be made of gold, copper, aluminum, or any metal exhibiting high conductivity and low loss for a DC and/or RF signal.

Each metal layer 501a is 12.5-μm in the x-axis, more than 10.0-μm in the y-axis, and 3.0-μm in the z-axis. Each metal layer 501b is 12.5-μm in the x-axis, more than 10.0-μm in the y-axis, and 3.0-μm in the z-axis. Each metal layer 503a is 3.5-μm in the x-axis, 11.4-μm in the y-axis, and 1.0-μm in the z-axis. Each metal layer 503h is 8.0-μm in the x-axis, 15.0-μm in the y-axis, and 1.0-μm in the z-axis. Each metal layer 505a is 2.6-μm in the x-axis, 8.2-μm in the y-axis, and 1.0-μm in the z-axis. Each metal layer 505b is 3.0-μm in the x-axis, 11.0-μm in the y-axis, and 1.0-μm in the z-axis. Each metal layer 507a is 3.6-μm in the x-axis, 11.2-μm in the y-axis, and 1.0-μm in the z-axis. Each metal layer 507b is 3.0-μm in the x-axis, 11.0-μm in the y-axis, and 1.0-μm in the z-axis. Each metal layer 507c is 1.0-μm in the z-axis. Each metal layer 509h is 5.8-μm in the x-axis, 11.7-μm in the y-axis, and 0.3-μm in the z-axis.

Collectively, as shown in FIGS. 12-14, this embodiment comprises (a) two interconnect vias 502a (each interconnect via 502a is 2.4-μm in the x-axis, 2.4-μm in the y-axis, and 1.0-μm in the z-axis) between first metal layer 501a and second metal layer 503a, and two interconnect vias 502b (each interconnect via 502b is 2.4-μm in the x-axis, 2.4-μm in the y-axis, and 1.0-μm in the z-axis) between first metal layer 501b and second metal layer 503b; (b) four interconnect vias 504a (each interconnect via 504a is 2.0-μm in the x-axis, 2.0-μm in the y-axis, and 1.0-μm in the z-axis) between second metal layer 503a and third metal layer 505a, and three interconnect vias 504b (each interconnect via 504b is 2.0-μm in the x-axis, 2.0-μm in the y-axis, and 1.0-μm in the z-axis) between second metal layer 503b and third metal layer 505b; (c) four interconnect vias 506a (each interconnect via 506a is 1.6-μm in the x-axis, 1.6-μm in the y-axis, and 1.0-μm in the z-axis) between third metal layer 505a and fourth metal layer 507a, and three interconnect vias 506b (each interconnect via 506b is 1.6-μm in the x-axis, 1.6-μm in the y-axis, and 1.0-μm in the z-axis) between third metal layer 505b and fourth metal layer 507b; and (d) one interconnect via 508b (each interconnect via 508b is 1.5-μm in the x-axis, 10.2-μm in the y-axis, and 0.6-μm in the z-axis) between fourth metal layer 507b and transistor metal layer 509b, and four interconnect vias 508c (each interconnect via 508c is 0.8-μm in the x-axis, 0.8-μm in the y-axis, and 0.8-μm in the z-axis) between fourth metal layer 507c and transistor base-contact metals 510 (each transistor base-contact metal 510 is 1.6-μm in the x-axis, 1.6-μm in the y-axis, and 0.06-μm in the z-axis). Additionally, each emitter finger 512 and 513 (each emitter finger 512-513 is 0.25-μm in the x-axis, 12.0-μm in the y-axis, and 0.8-μm in the z-axis) is positioned inside and surrounded by transistor base-contact metal 510.

First metal layer 501a provides connections for an input to the emitter, while first metal layer 501b provides connections for an output at the collector. The input or output can be a DC and/or RF signal, Fourth metal layer 507a provides connections to emitter fingers 512 and 513, which are exposed above the BCB and accessible. As shown in FIGS. 12-14, the input at first metal layer 501a connects with the emitter fingers 512 and 513 via the following components: first metal layer 501a, two interconnect vias 502a, second metal layer 503a, four interconnect vias 504a, third metal layer 505a, four interconnect vias 506a, fourth metal layer 507a, and emitter fingers 512 and 513, which are exposed above the BCB and accessible. More particularly, in this embodiment, the emitter input at first metal layer 501a connects to the transistor emitters 512 and 513 symmetrically along the y-axis of the transistor, as shown in FIGS. 12-14, hence the dual-emitter configuration. Thus, each emitter feed allows the input at first metal layer 501a to connect with the transistor emitters 512 and 513 by way of the following path: first metal layer 501a, two interconnect vias 502a, second metal layer 503a, four interconnect vias 504a, third metal layer 505a, four interconnect vias 506a, fourth metal layer 507a, and emitter fingers 512 or 513.

Figure 16:
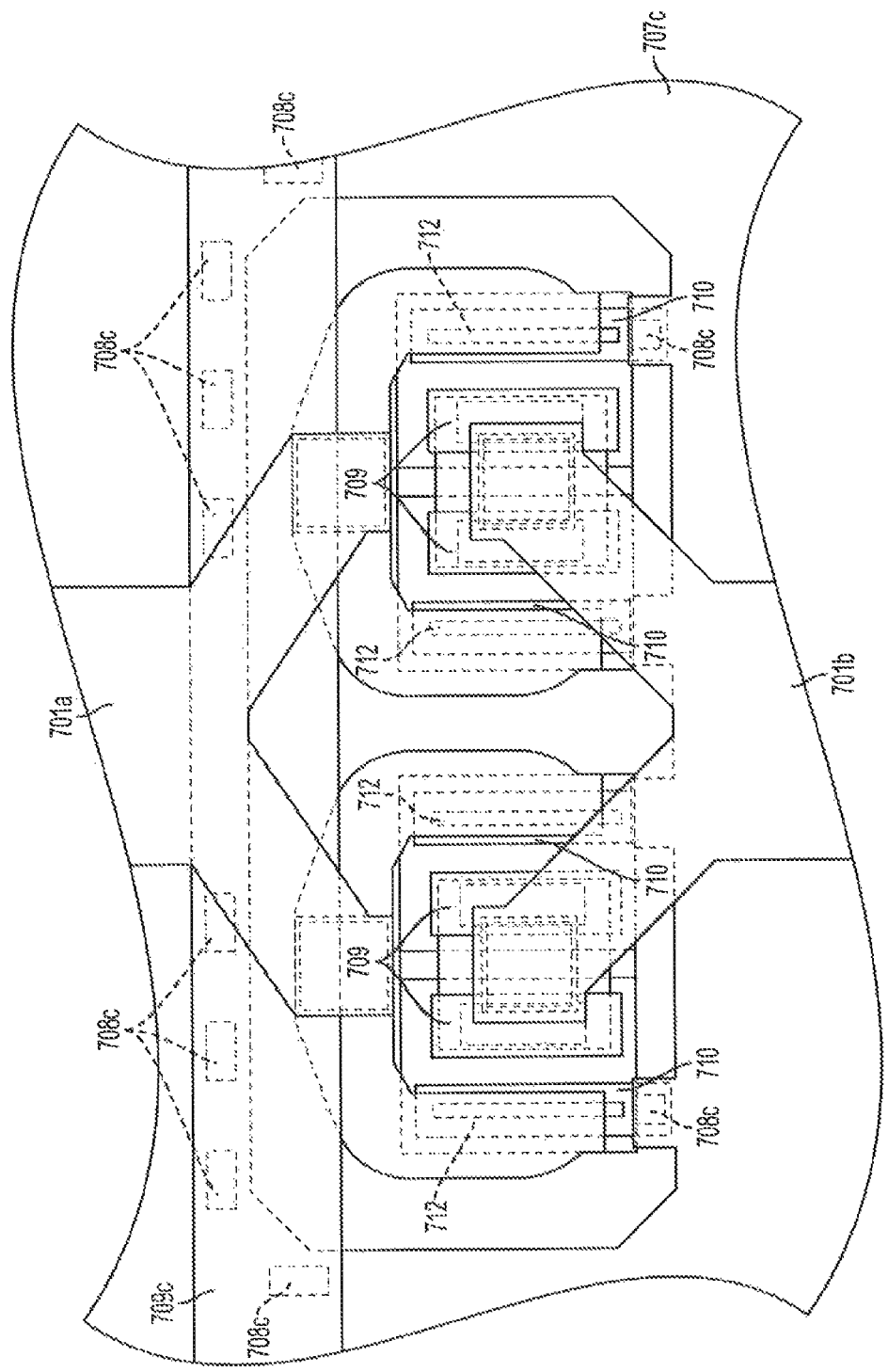
FIG. 16 is a top-view of an exemplary embodiment of a traditional layout for a dual-emitter, four-finger, common-base HBT.

As shown in FIGS. 12-14, the transistor collector output at first metal layer 501b connects to the transistor semiconductor at transistor metal layer 509b by way of the following components: first metal layer 501b, two interconnect vias 502b, second metal layer 503b, three interconnect vias 504b, third metal layer 505b, three interconnect vias 506b, fourth metal layer 507b, one interconnect via 508b, and transistor metal layer 509b. Transistor base-contact metals 510 provide connections to the transistor semiconductor. Thus, as shown in FIGS. 12-14, fourth metal layer 507c connects to the transistor semiconductor via the following path: transistor metal layer 507c, interconnect vias 508c, and transistor base-contact metals 510. As shown in FIGS. 12-14, this novel spatial arrangement of said HBT's vertical interconnect, comprising (a) metal layers 501a, 501b, 503a, 503b, 505a, 505b, 507a, 507b, 507c, and 509b, (b) vias 502a, 502b, 504a, 504b, 506a, 506b, 508a, 508b, and 510, (c) emitter fingers 512 and 513, reduces the effective base metal resistance along the emitter finger by approximately 75 percent, and reduces the effective base metal inductance along the emitter by more than 50 percent. Additionally, emitter fingers 512 and 513 are each approximately 12-μm in length. Emitter fingers 512 and 513 are arranged along both x-lines and y-lines of symmetry, resulting in a significant reduction in thermal impedance, as compared to a traditional layout which would be a dual-emitter, four finger, common-base HBT. FIG. 16 depicts a traditional layout for a dual-emitter, four-finger, common-base HBT.

FIG. 15 is a top-view of an exemplary embodiment of a traditional layout for a four finger common-emitter HBT. FIG. 15 is provided to show the advantages and novelties of the present invention's four-finger, common-emitter configuration HBT, as shown in FIGS. 8-11. Thus, of interest in FIG. 15 are the four emitter fingers referenced as emitter fingers 612. As shown in FIG. 15, each emitter finger 612 is approximately 6-μm in length and arranged parallel to each other. More particularly, each emitter finger 612 is 0.5-μm in the x-axis, 6.0-μm in the y-axis, and 0.8-μm in the z-axis. By contrast, as discussed and shown in FIGS. 8-11, the four emitter fingers, referenced as emitter fingers 412, 413, 414, and 415, in the present invention's four-finger, common-emitter configuration HBT are arranged in a manner that results effectively in two long emitter fingers. More particularly, each emitter finger 412-415 is 0.25-μm in the x-axis, 6.0-μm in the y-axis, and 0.8-μm in the z-axis. Thus, when emitter finger 412-415 are arranged in the manner shown in FIGS. 12-14 (i.e. the pair of (a) emitter fingers 412 and 413, and (b) emitter fingers 414 and 415), there are effectively two long emitter fingers having 12.0-μm in the y-axis. These two long emitter fingers result in a significant reduction in thermal impedance, as compared to a traditional layout of a four-finger, common-emitter HBT, as shown in FIG. 15.

FIG. 16 is a top-view of an exemplary embodiment of a traditional layout for a dual emitter, four-finger, common-base HBT. FIG. 16 is provided to show the advantages and novelties of the present invention's two-finger, common-base configuration HBT, as shown in FIGS. 12-14. Thus, of interest in FIG. 16 are the emitter fingers referenced as emitter fingers 712. As shown in FIG. 16, each emitter finger 712 is approximately 6-μm in length and arranged parallel to each other. More particularly, each emitter finger 712 is 0.5-μm in the x-axis, 6.0-μm in the y-axis, and 0.8-μm in the z-axis. By contrast, as discussed and shown in FIGS. 12-14, the two emitter fingers, referenced as emitter fingers 512 and 513, in the present invention's two-finger, common-base configuration HBT are each approximately 12-μm in length and arranged in a manner that results in a significant reduction in thermal impedance, as compared to a traditional layout of a four-finger, common-base HBT, as shown in FIG. 16. More particularly, each emitter finger 512-513 is 0.25-μm in the x-axis, 12.0-μm in the y-axis, and 0.8-μm in the z-axis.

Figure 17:
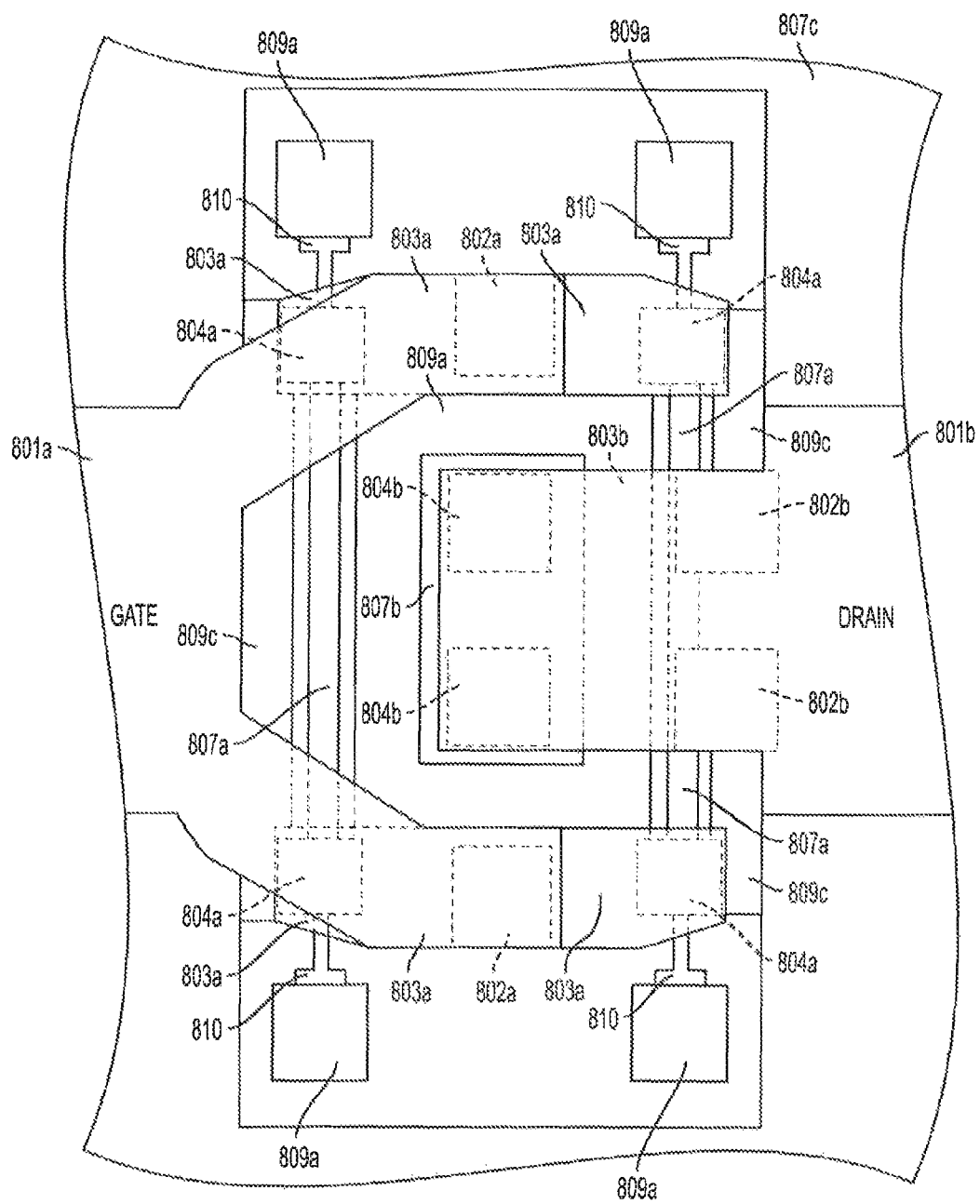
FIG. 17 is a top-view of another exemplary embodiment of the present invention's dual-gate, two-gate finger, common-source configuration HEMT.
Figure 18:
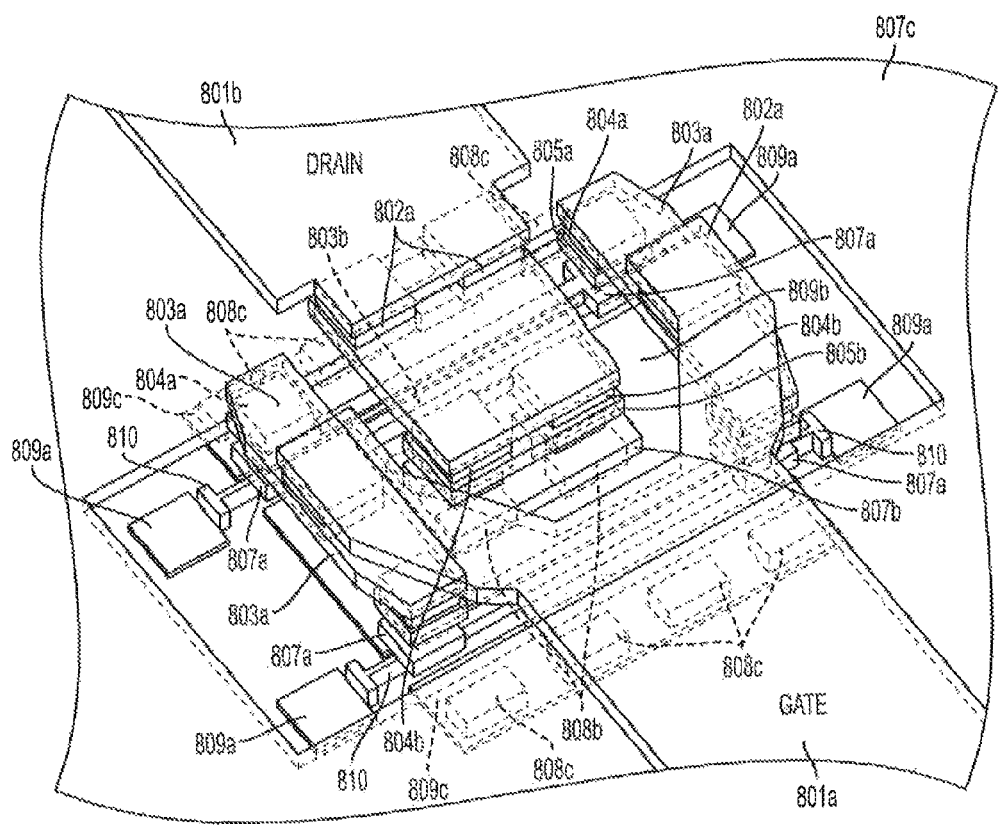
FIG. 18 is a first angled-view of another exemplary embodiment of the present invention's dual-gate, two-gate finger, common-source configuration HEMT.
Figure 19:
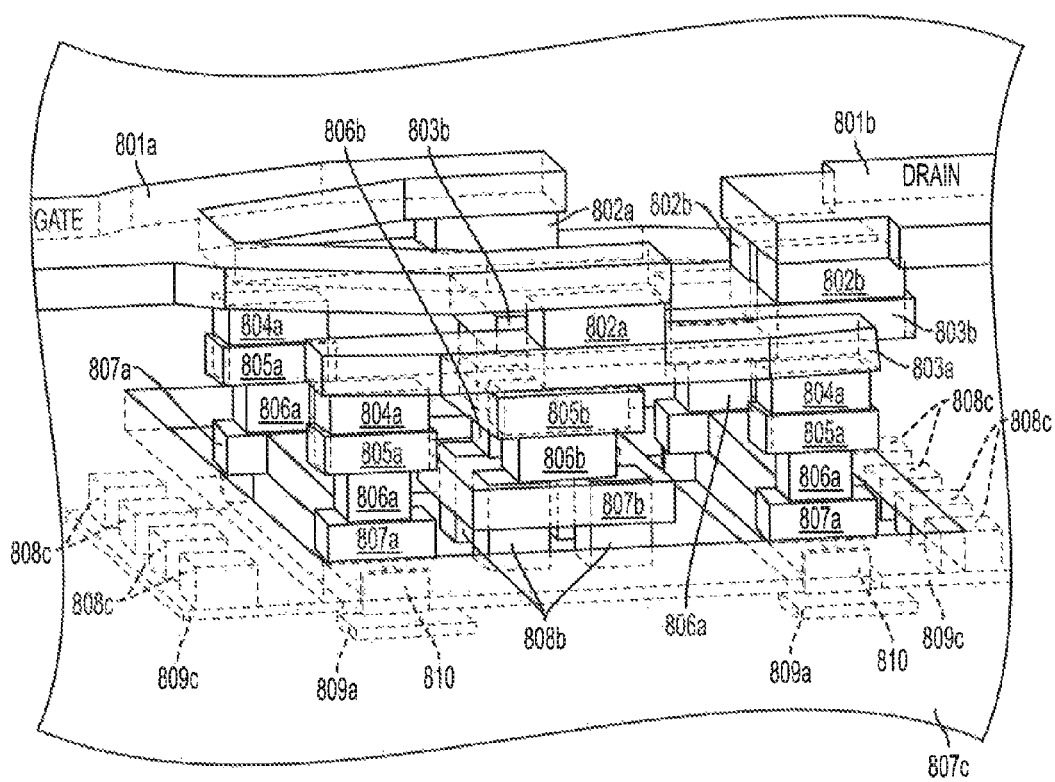
FIG. 19 is a second angled-view of another exemplary embodiment of the present invention's dual-gate, two-gate finger, common-source configuration HEMT.

FIG. 17 depict another exemplary embodiment of the present invention's dual-gate, two-finger, common-source configuration HEMT. FIG. 17 is a top-view while FIGS. 18-19 are angled-views of this embodiment. The reference numbers in FIG. 17 are re-used in FIGS. 18-19 to indicate correspondence between referenced elements. Typically, in a common-source HEMT configuration, an input is applied at a gate, an output is applied at a drain, and RF ground is applied at the source. In this embodiment, there are five metal layers and interconnect vias positioned between consecutive metal layers. As shown in FIGS. 17-19, from top to bottom, there is a first metal layer comprising 801a and 801b, interconnect vias 802a and 802b, a second metal layer comprising 803a and 803b, interconnect vias 804a and 804b, a third metal layer comprising 805a and 805b, interconnect vias 806a and 806b, a fourth metal layer comprising 807a, 807b and 807c, interconnect vias 808b and 808c, and a transistor metal layer comprising 809a, 809b, and 809c. Additionally, there are two gate fingers 810. As shown in FIGS. 17-19, each of these metal layers and vias are configured differently. Each metal layer or via can be made of gold, copper, aluminum, or any metal exhibiting high conductivity and low loss for a DC and/or RF signal.

Each metal layer 801a is 12.5-μm to 21.0-μm in the x-axis, more than 10.0-μm in the y-axis, and 1.0-μm in the z-axis. Each metal layer 801b is 12.5-μm in the x-axis, more than 10.0-μm in the y-axis, and 1.0-μm in the z-axis. Each metal layer 803a is 3.7-μm in the x-axis, 13.8-μm in the y-axis, and 1.0-μm in the z-axis. Each metal layer 803b is 8.8-μm in the x-axis, 10.4-μm in the y-axis, and 1.0-μm in the z-axis. Each metal layer 805a is 2.8-μm in the x-axis, 2.8-μm in the y-axis, and 1.0-μm in the z-axis. Each metal layer 805b is 8.6-μm in the x-axis, 3.6-μm in the y-axis, and 1.0-μm in the z-axis. Each metal layer 807a is 19.1-μm in the x-axis, 2.6-μm in the y-axis, and 1.0-μm in the z-axis. Each metal layer 807b is 9.4-μm in the x-axis, 5.0-μm in the y-axis, and 1.0-μm in the z-axis. Each metal layer 807c is 1.0-μm in the z-axis. Each metal layer 809a is 3.0-μm in the x-axis, 3.0-μm in the y-axis, and 0.25-μm in the z-axis. Each metal layer 809b is 19.0-μm in the x-axis, 9.0-μm in the y-axis, and 0.25-μm in the z-axis. Each metal layer 809c is 19.0-μm in the x-axis, 4.0-μm in the y-axis, and 0.25-μm in the z-axis.

Collectively, as shown in FIGS. 17-19, this embodiment comprises (a) two interconnect vias 802a (each interconnect via 802a is 3.0-μm in the x-axis, 3.0-μm in the y-axis, and 1.0-μm in the z-axis) between first metal layer 801a and second metal layer 803a, and two interconnect vias 802b (each interconnect via 802b is 3.0-μm in the x-axis, 3.0-μm in the y-axis, and 1.0-μm in the z-axis) between first metal layer 801b and second metal layer 803b; (b) four interconnect vias 804a (each interconnect via 804a is 2.4-μm in the x-axis, 2.4-μm in the y-axis, and 1.0-μm in the z-axis) between second metal layer 803a and third metal layer 805a, and two interconnect vias 804b (each interconnect via 804b is 3.0-μm in the x-axis, 3.0-μm in the y-axis, and 1.0-μm in the z-axis) between second metal layer 803b and third metal layer 805b; (c) four interconnect vias 806a (each interconnect via 806a is 1.6-μm in the x-axis, 1.6-μm in the y-axis, and 1.0-μm in the z-axis) between third metal layer 805a and fourth metal layer 807a, and two interconnect vias 806b (each interconnect via 806b is 2.4-μm in the x-axis, 2.4-μm in the y-axis, and 1.0-μm in the z-axis) between third metal layer 805b and fourth metal layer 807b; and (d) four interconnect vias 808b (each interconnect via 808b is 3.0-μm in the x-axis, 1.5-μm in the y-axis, and 0.7-μm in the z-axis) between fourth metal layer 807b and transistor metal layer 809b, and eight interconnect vias 808e (each interconnect via 808b is 3.0-μm in the x-axis, 1.5-μm in the y-axis, and 0.7-μm in the z-axis) between fourth metal layer 807c and transistor metal layer 809c. Additionally, as shown in FIGS. 17-19, there are two gate fingers 810 (each gate finger 810 is 25.0-μm in the x-axis, 0.4-μm in the y-axis, and 0.8-μm in the z-axis), whose top is exposed above the BCB dielectric and is directly accessible, whereby each gate finger is directly connected to fourth metal layer 807a Whereby each gate finger connects one gate feed's transistor layer 809a to the other gate feed's transistor metal layer 809a.

First metal layer 801a provides connections for an input at the gate, while first metal layer 801b provides connections for an output at the drain. The input or output can be a DC or RF signal. Transistor metal layer 810, 809b, and 809c provide connections to the transistor semiconductor. As shown in FIGS. 17-19, the gate input at first metal layer 801a connects to the transistor semiconductor at transistor metal layer 810 by way of the following components: first metal layer 801a, two interconnect vias 802a, second metal layer 803a, four interconnect vias 804a, third metal layer 805a, four interconnect vias 806a, fourth metal layer 807a, and two gate fingers 810. More particularly, in this embodiment, the gate input at first metal layer 801a connects with the transistor semiconductor at transistor metal layer 810 via two gate feeds, as shown in FIGS. 17-19, hence the dual-gate configuration. Thus, each gate feed allows the input at first metal layer 801a to connect with the transistor semiconductor at transistor metal layer 810 by way of the following path: first metal layer 801a, one interconnect via 802a, second metal layer 803a, two interconnect visa 804a, third metal layer 805a, two interconnect vias 806a, fourth metal layer 807a, and one gate finger 810.

As shown in FIGS. 17-19, the drain output at first metal layer 801b connects to the transistor semiconductor at transistor metal layer 809b by way of the following components: first metal layer 101b, two interconnect vias 802b, second metal layer 803b, two interconnect via 804b, third metal layer 805h, two interconnect vias 806b, fourth metal layer 807b, four interconnect vias 808b, and transistor metal layer 809b. Finally, as shown in FIGS. 17-19, the connection at fourth metal layer 807c connects with the transistor semiconductor at transistor metal layer 809c by way of the following components: fourth metal layer 807e, eight interconnect vias 808c, and transistor metal layer 809c. As shown in FIGS. 17-19, the eight interconnect vias 808c are divided into two sets of four interconnect vias 808c.

As shown in FIGS. 17-19, the novel spatial arrangement of said HEMT's vertical interconnect, comprising (a) metal layers 801a, 801b, 803a, 803b, 805a, 805b, 807a, 807b, 807c, 809a, 809b, and 809c, and (b) vias 802a, 802b, 804a, 804b, 806a, 806b, 808b, 808c, and 810, reduces the gate finger metal inductance by more than 75 percent, completely removes the effective input gate feed resistance ($R_{feed,\ 1}$), and the effective gate-head resistance ($R_{feed,\ 2}$) along the active FET region is reduced by approximately 90 percent.

Exemplary embodiments of the invention have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A transistor for reduced device parasitics and improved thermal impedance, comprising:

a base input terminal for receiving an input current;

a collector output terminal for outputting an output current;

a plurality of first metal layers positioned along a first x-y plane and including a metal layer connected to the base input terminal and another metal layer connected to the collector output terminal;

a plurality of first interconnect metal vias positioned below one or more of the plurality of first metal layers and connected to one or more of the plurality of first metal layers;

a plurality of second metal layers positioned along a second x-y plane and below one or more of the plurality of first interconnect metal vias, and connected to one or more of the plurality of first interconnect metal vias;

a plurality of second interconnect metal vias positioned below one or more of the plurality of second metal layers and connected to one or more of the plurality of second metal layers;

a plurality of third metal layers positioned along a third x-y plane and below one or more of the plurality of second interconnect metal vias and connected to one or more of the plurality of second interconnect metal vias;

a plurality of third interconnect metal vias positioned below one or more of the plurality of third metal layers and connected to one or more of the plurality of third metal layers;

a plurality of fourth metal layers positioned along a fourth x-y plane and below one or more of the plurality of third interconnect metal vias and connected to one or more of the plurality of third interconnect metal vias;

a plurality of fourth interconnect metal vias positioned below one or more of the plurality of fourth metal layers and connected to one or more of the plurality of fourth metal layers;

one or more transistor metal layers positioned along a fifth x-y plane and below one or more of the fourth interconnect metal vias and connected to one or more of the fourth interconnect metal vias;

a transistor semiconductor portion of the transistor connected to the one or more transistor metal layers;

a transistor base-contact metal positioned along a transistor base x-y plane that is below one or more of the plurality of fourth interconnect metal vias, and connected to one or more of the plurality of fourth interconnect metal vias and the transistor semiconductor portion, the transistor base-contact metal having a width along an x-axis and an opening; and a first metal emitter finger positioned within the opening of the transistor base-contact metal and spaced apart from the transistor base-contact metal, the first metal emitter finger having a width along an x-axis that is shorter than the width of the transistor base-contact metal.

2. The transistor of claim 1, wherein the transistor is a heterojunction bipolar transistor (HBT) with a common-emitter configuration.

3. The transistor of claim 1, wherein the transistor is a HBT with a common-base configuration.

4. The transistor of claim 1, wherein the first metal emitter finger is configured for transmitting signals to and from an emitter of the transistor.

5. The transistor of claim 4, wherein the transistor consists of four emitter fingers, and each pair of emitter fingers is symmetrically arranged along an x-axis and a y-axis.

6. The transistor of claim 4, further comprising a second metal emitter finger arranged in parallel to the first metal emitter finger along a common emitter finger x-y plane.

7. A method for forming multiple connections to a transistor having a transistor semiconductor portion, for reduced device parasitics and reduced thermal impedance, the method comprising the steps of:

fabricating one or more transistor metal layers positioned along a fifth x-y plane and connected to the transistor semiconductor portion;

fabricating a transistor base-contact metal positioned along a transistor base x-y plane and having a length along a y-axis, a width along an x-axis and an opening, and connected to the transistor semiconductor portion;

fabricating a first metal emitter finger positioned within the opening of the transistor base-contact metal and spaced apart from the transistor base-contact metal, the first metal emitter finger having a length along a y-axis and a width along an x-axis that is shorter than the width of the transistor base-contact metal;

fabricating a plurality of fourth interconnect metal vias positioned above the one or more transistor metal layers and connected to one or more of the transistor metal layers, one or more of the plurality of fourth interconnect metal vias, and the transistor semiconductor portion;

fabricating a plurality of fourth metal layers positioned above one or more of the plurality of fourth interconnect metal vias and along a fourth x-y plane, and connected to one or more of the plurality of fourth interconnect metal vias;

fabricating a plurality of third interconnect metal vias positioned above one or more the plurality of fourth metal layers, and connected to one or more of the plurality of fourth metal layers;

fabricating a plurality of third metal layers positioned above one or more of the plurality of third interconnect metal vias and along a third x-y plane, and connected to one or more of the plurality of third interconnect metal vias;

fabricating a plurality of second interconnect metal vias positioned above one or more of the plurality of third metal layers, and connected to one or more of the plurality of third metal layers;

fabricating a plurality of second metal layers positioned above one or more of the second plurality of interconnect metal vias and along a second x-y plane, and connected to one or more of the plurality of second interconnect metal vias;

fabricating a plurality of first interconnect metal vias positioned above one or more of the plurality of second metal layers, and connected to one or more of the plurality of second metal layers; and fabricating a plurality of first metal layers positioned above one or more of the first plurality of interconnect metal vias and along a first x-y plane, the plurality of first metal layers connected to one or more of the plurality of first interconnect metal vias and including a metal layer connected to a base input terminal for receiving an input current and another metal layer connected to a collector output terminal for outputting an output current.

8. The method of claim 7, further comprising the step of fabricating four metal fingers, wherein each pair of metal fingers is symmetrically arranged along an x-axis and a y-axis.

9. The method of claim 7, further comprising the step of fabricating a second metal emitter finger arranged in parallel to the first metal emitter finger, the first metal emitter finger and the second metal emitter finger symmetrically arranged along a common emitter finger x-y plane.

* * * * *